United States Patent
Choi et al.

(10) Patent No.: US 11,024,363 B2
(45) Date of Patent: Jun. 1, 2021

(54) MEMORY DEVICE HAVING DIFFERENT NUMBERS OF BITS STORED IN MEMORY CELLS

(71) Applicant: SAMSUNG ELECTRONICS CO., LTD., Suwon-si (KR)

(72) Inventors: Yonghyuk Choi, Suwon-si (KR); Bongsoon Lim, Seoul (KR); Jaeduk Yu, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/810,527

(22) Filed: Mar. 5, 2020

(65) Prior Publication Data

US 2021/0043244 A1    Feb. 11, 2021

(30) Foreign Application Priority Data

Aug. 6, 2019    (KR) .......................... 10-2019-0095527

(51) Int. Cl.

| | | |
|---|---|---|
| *G11C 5/02* | (2006.01) | |
| *G11C 11/408* | (2006.01) | |
| *G11C 11/4094* | (2006.01) | |
| *G11C 16/10* | (2006.01) | |
| *G11C 16/26* | (2006.01) | |
| *G11C 16/04* | (2006.01) | |

(52) U.S. Cl.
CPC .......... *G11C 11/4085* (2013.01); *G11C 5/025* (2013.01); *G11C 11/4094* (2013.01); *G11C 16/045* (2013.01); *G11C 16/10* (2013.01); *G11C 16/26* (2013.01)

(58) Field of Classification Search
CPC ... G11C 11/4085; G11C 5/025; G11C 16/045; G11C 16/26; G11C 11/4094; G11C 16/10
See application file for complete search history.

(56) References Cited

U.S. PATENT DOCUMENTS

| | | |
|---|---|---|
| 9,449,987 B1 | 9/2016 | Miyata et al. |
| 9,515,080 B2 | 12/2016 | Takahashi et al. |
| 9,524,784 B1 | 12/2016 | Cheng et al. |
| 9,711,228 B1 | 7/2017 | Tanzawa |
| 9,941,297 B2 | 4/2018 | Nishikawa et al. |
| 10,256,115 B2 | 4/2019 | Lee |
| 2018/0233207 A1 | 8/2018 | Seo |
| 2018/0322930 A1 | 11/2018 | Sakui et al. |
| 2019/0102104 A1 | 4/2019 | Righetti et al. |
| 2020/0119145 A1* | 4/2020 | Park ..................... H01L 21/762 |

* cited by examiner

*Primary Examiner* — David Lam
(74) *Attorney, Agent, or Firm* — F. Chau & Associates, LLC

(57) ABSTRACT

A memory device includes word lines stacked on an upper surface of a substrate, channel structures penetrating through the word lines, and each including channel regions connected to one another in a first direction perpendicular to the upper surface of the substrate, and word-line cuts extending in the first direction and dividing the word lines to blocks. The word lines and the channel structures provide memory cell strings, and each of the memory cell strings include memory cells arranged in the first direction. The memory cells included in at least one of the memory cell strings include a first memory cell and a second memory cell disposed at different positions in the first direction, and the number of bits of data stored in the first memory cell is less than the number of bits of data stored in the second memory cell.

20 Claims, 30 Drawing Sheets

MEMORY DEVICE HAVING DIFFERENT NUMBERS OF BITS STORED IN MEMORY CELLS

CROSS-REFERENCE TO RELATED APPLICATION

This application claims priority under 35 U.S.C. § 119 to Korean Patent Application No. 10-2019-0095527, filed on Aug. 6, 2019 in the Korean Intellectual Property Office, the disclosure of which is incorporated by reference herein in its entirety.

TECHNICAL FIELD

Exemplary embodiments of the present inventive concept relate to a memory device having different numbers of bits stored in memory cells.

DISCUSSION OF RELATED ART

A memory device provides a function of writing or erasing data and reading written data. A memory device may be a non-volatile memory device or a volatile memory device, and a non-volatile memory device may maintain written data as is, even when power is cut off. Data storage capacity for memory devices has increased, which has increased the need for improving integration density of memory devices.

SUMMARY

According to an exemplary embodiment of the present inventive concept, a memory device includes a plurality of word lines stacked on an upper surface of a substrate, a plurality of channel structures penetrating through the plurality of word lines, and each including a plurality of channel regions connected to one another in a first direction perpendicular to the upper surface of the substrate, and word-line cuts extending in the first direction and dividing the plurality of word lines to a plurality of blocks. The plurality of word lines and the plurality of channel structures provide a plurality of memory cell strings, and each of the plurality of memory cell strings include a plurality of memory cells arranged in the first direction. The plurality of memory cells included in at least one of the memory cell strings include a first memory cell and a second memory cell disposed at different positions in the first direction, and the number of bits of data stored in the first memory cell is less than the number of bits of data stored in the second memory cell.

According to an exemplary embodiment of the present inventive concept, a memory device includes a lower stack structure including lower word lines stacked on an upper surface of a substrate, and lower channel regions extending from the upper surface of the substrate and penetrating through the lower word lines, where the lower word lines and the lower channel regions provide lower memory cells, and an upper stack structure including upper word lines stacked on the lower stack structure, and upper channel regions penetrating through the upper word lines and connected to the lower channel regions, where the upper word lines and the upper channel regions provide upper memory cells. Data storage capacity of the lower memory cells is greater than data storage capacity of the upper memory cells.

According to an exemplary embodiment of the present inventive concept, a memory device includes ground select transistors connected to a common source line and a ground select line, string select transistors connected to bit lines and at least one string select line, memory cells connected to one another in series between the ground select transistors and the string select transistors and connected to word lines, and a memory controller configured to control the ground select transistors, the string select transistors, and the memory cells. The ground select transistors, the string select transistors, and the memory cells provide a single memory block. Capacity of data stored in first memory cells connected to a first word line of the word lines by the memory controller is different from capacity of data stored in second memory cells connected to a second word line by the memory controller. The second word line is different from the first word line.

BRIEF DESCRIPTION OF DRAWINGS

The above and other aspects and features of the present inventive concept will be more clearly understood by describing in detail exemplary embodiments thereof with reference to the accompanying drawings.

DETAILED DESCRIPTION OF THE EMBODIMENTS

Figure 1:
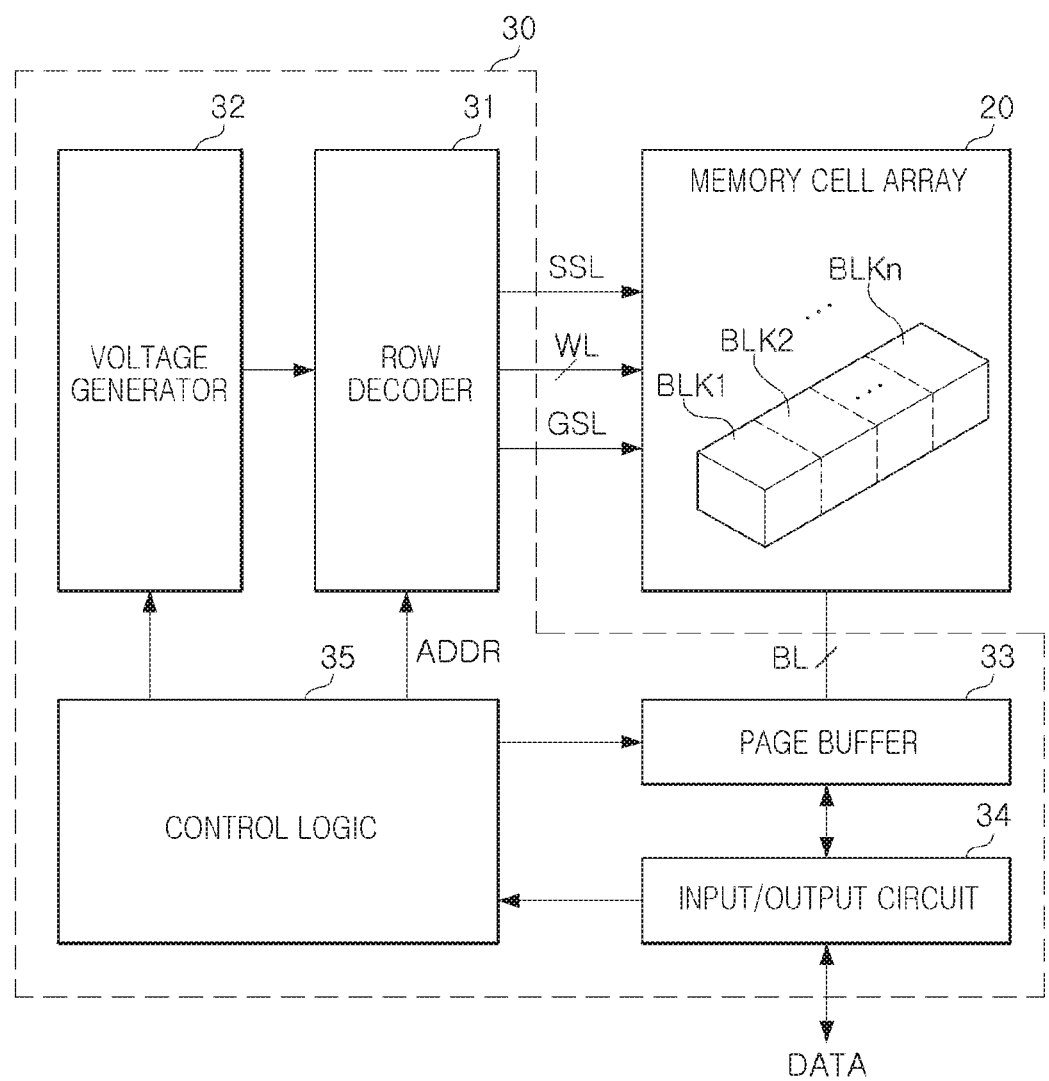
FIG. 1 is a block diagram illustrating a memory device according to an exemplary embodiment of the present inventive concept.

Exemplary embodiments of the present inventive concept provide a memory device which may have improved operation performance by determining the number of bits of data stored in memory cells in consideration of properties of word lines connected to the memory cells.

Hereinafter, exemplary embodiments of the present inventive concept will be described in detail with reference to the accompanying drawings. Like reference numerals may refer to like elements throughout this application.

FIG. 1 is a block diagram illustrating a memory device according to an exemplary embodiment of the present inventive concept.

Referring to FIG. 1, a memory device 10 may include a memory cell array 20 and a peripheral circuit 30. The peripheral circuit 30 may include a row decoder 31, a voltage generator 32, a page buffer 33, an input and output circuit 34, a control logic 35, and other circuits.

The memory cell array 20 may include a plurality of memory cells, and may be divided into a plurality of blocks BLK1 to BLKn. The plurality of memory cells may be connected to the row decoder 31 through a string select line SSL, word lines WL, and a ground select line GSL, and may be connected to the page buffer 33 through bit lines BL. As an example, in each of the plurality of blocks BLK1 to BLKn, a plurality of memory cells arranged on the same level on a substrate may be connected to the same word line WL, and a plurality of memory cells disposed on a plane perpendicular to an upper surface of the substrate may provide memory cell strings sharing a single channel region. Portions of the memory cell strings included in each of the plurality of blocks BLK1 to BLKn may be connected to the same bit line BL.

The row decoder 31 may decode address data ADDR input from the control logic 35, and may generate and transfer voltages for driving the word lines WL. The row decoder 31 may input the word line voltages, generated by the voltage generator 32 in response to control of the control logic 35, to the word lines WL. As an example, the row decoder 31 may be connected to the word lines WL through pass transistors, and the row decoder 31 may input the word line voltage to the word lines WL when the pass transistors are turned on.

The page buffer 33 may be connected to the memory cell array 20 through the bit lines BL, and may read out data stored in the memory cells or may write data in the memory cells. The page buffer 33 may include a column decoder and a sense amplifier. The column decoder may select at least a portion of the bit lines BL of the memory cell array 20, and the sense amplifier may read out data of a memory cell connected to a bit line BL selected by the column decoder in a reading operation.

The input and output circuit 34 may receive data DATA and may transfer the data DATA to the page buffer 33 in a program operation, and may externally output the data DATA read out from the memory cell array 20 by the page buffer 33. The input and output circuit 34 may transfer an address or a common word received from an external memory controller to the control logic 35.

The control logic 35 may control operations of the row decoder 31, the voltage generator 32, the page buffer 33, and others. In an exemplary embodiment of the present inventive concept, the control logic 35 may operate in accordance with a control signal and an external voltage transferred from an external memory controller, and others.

The voltage generator 32 may generate control voltages for operation of the memory device 10, such as a program voltage, a reading voltage, an erasing voltage, a pass voltage, or the like, for example, using a power voltage input from an external entity. The control voltages generated by the voltage generator 32 may be supplied to the peripheral circuit 30, or may be input to the memory cell array 20 through the row decoder 31 and other circuits.

As an example, in a program operation, a program voltage may be input to a selected word line connected to a selected memory cell to which data is written. Additionally, a pass voltage, smaller than a program voltage, may be input to non-selected word lines connected to non-selected memory cells included in a single memory cell string along with the selected memory cell and sharing a channel region with the selected memory cell. The program operation may be executed by page unit.

In an exemplary embodiment of the present inventive concept, in a reading operation, a reading voltage may be input to a selected word line connected to a selected memory cell from which data is read out, and a pass voltage may be input to non-selected word lines connected to non-selected memory cells sharing a channel region with the selected memory cell. In an exemplary embodiment of the inventive concept in which each of the memory cells stores data having a plurality of bits, the row decoder 31 may input a plurality of reading voltages having different magnitudes to the selected word line. A reading operation may be performed by page unit.

Figure 2:
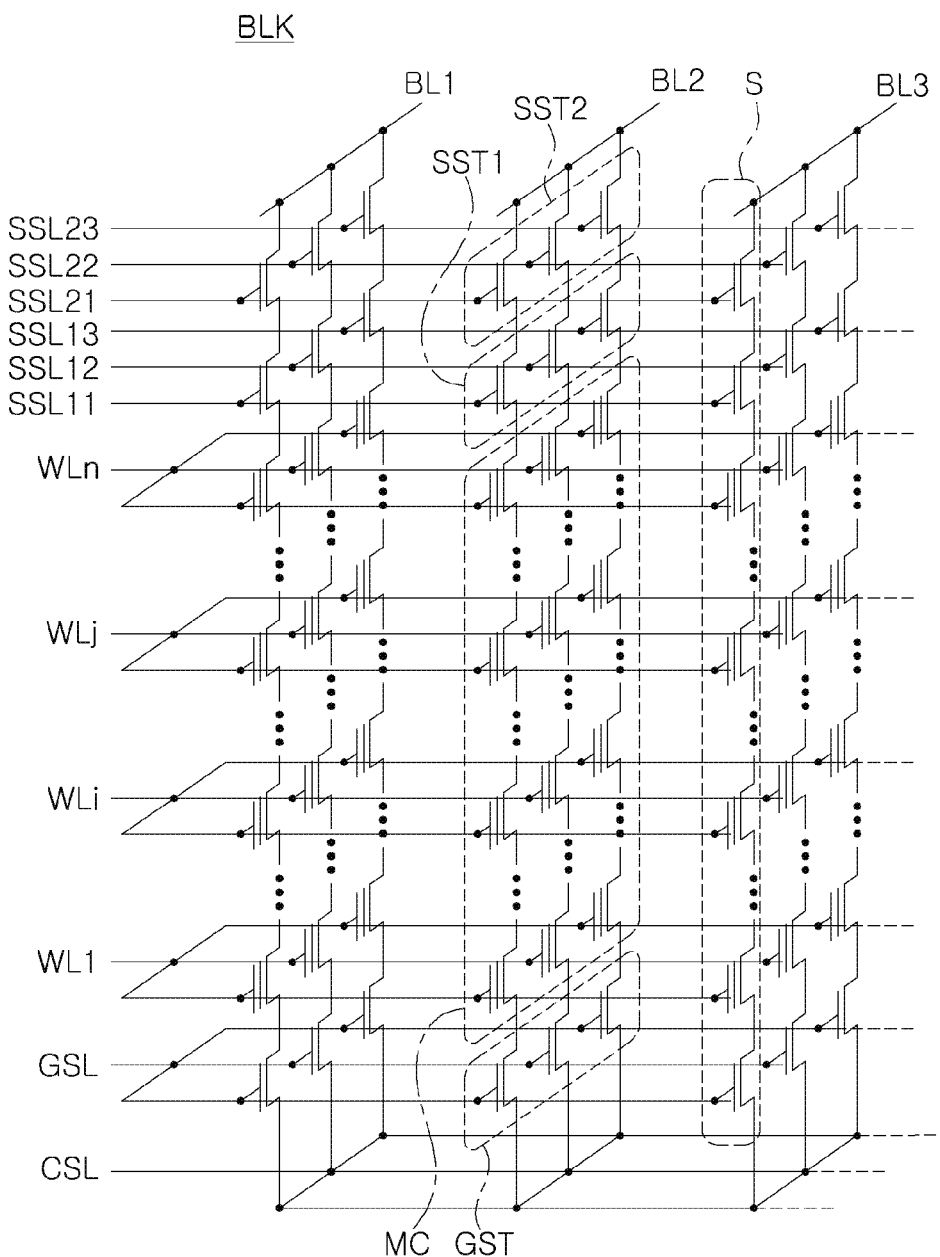
FIG. 2 is a circuit diagram illustrating a memory device according to an exemplary embodiment of the present inventive concept.

FIG. 2 is a circuit diagram illustrating a memory device according to an exemplary embodiment of the present inventive concept.

Referring to FIG. 2, a single memory block BLK may include a plurality of memory cell strings S, and at least portions of memory cell strings S may share word lines WL1 to WLn and/or bit lines BL1 to BL3.

Each of the memory cell strings S may include a plurality of memory cells MC connected between first and second string select transistors SST1 and SST2 and a ground select transistor GST. The first and second string select transistors SST1 and SST2 may be connected to each other in series, and the second string select transistor SST2 disposed in an upper portion may be connected to one of the bit lines BL1 to BL3. The ground select transistor GST may be connected to a common source line CSL. The memory cells MC included in the memory cell strings S may share a single channel region.

The plurality of memory cells MC may be connected to one another in series between the first and second string select transistors SST1 and SST2 and the ground select transistor GST. In exemplary embodiments of the present inventive concept, the number of the string select transistors SST1 and SST2 and the number of the ground select transistor GST may be varied, and each of the memory cell strings S may further include at least one dummy memory cell. As an example, the dummy memory cells may be connected between the first string select transistor SST1 and the memory cells MC, and/or between the ground select transistor GST and the memory cells MC.

Gate electrodes of the plurality of memory cells MC may be connected to the word lines WL1 to WLn. Gate electrodes of the ground select transistor GST may be connected to a ground select line GSL, and gate electrodes of the first and second string select transistors SST1 and SST2 may be connected to string select lines SSL11 to SSL23.

The ground select line GSL, the word lines WL1 to WLn, and the string select lines SSL11 to SSL23 may be stacked on an upper surface of a substrate in a first direction perpendicular to the upper surface. The ground select line GSL, the word lines WL1 to WLn, and the string select lines SSL11 to SSL23 may be penetrated by a channel structure including a channel region. The channel structure may be connected to one of the bit lines BL1 to BL3.

As the number of layers of the stacked word lines WL1 to WLn increases to improve integration density of the memory device, the channel structure may have a tapered structure having a width decreasing towards the substrate in the first direction. Word-line cuts formed on a boundary between blocks BLK may also have a tapered structure. Accordingly, a width of each of the word lines WL1 to WLn may be varied depending on the number of the layers, and there may be a difference in properties of the memory cells MC caused by a difference in resistance of the word lines WL1 to WLn. Even when the channel structure includes a plurality of channel regions in accordance with an increase of the number of layers of the stacked word lines WL1 to WLn, there may be a difference in properties of the memory cells MC.

In an exemplary embodiment of the present inventive concept, data having different numbers of bits may be stored in each of the memory cells MC included in a single memory cell string S in consideration of properties of the memory cells MC. As an example, only data having two or more bits may be stored in a memory cell expected to have relatively excellent properties, and only one-bit data may be stored in a memory cell expected to have relatively degraded properties. In the description below, the above-described configuration will be described in greater detail with reference to FIGS. 3 to 5.

Figure 3:
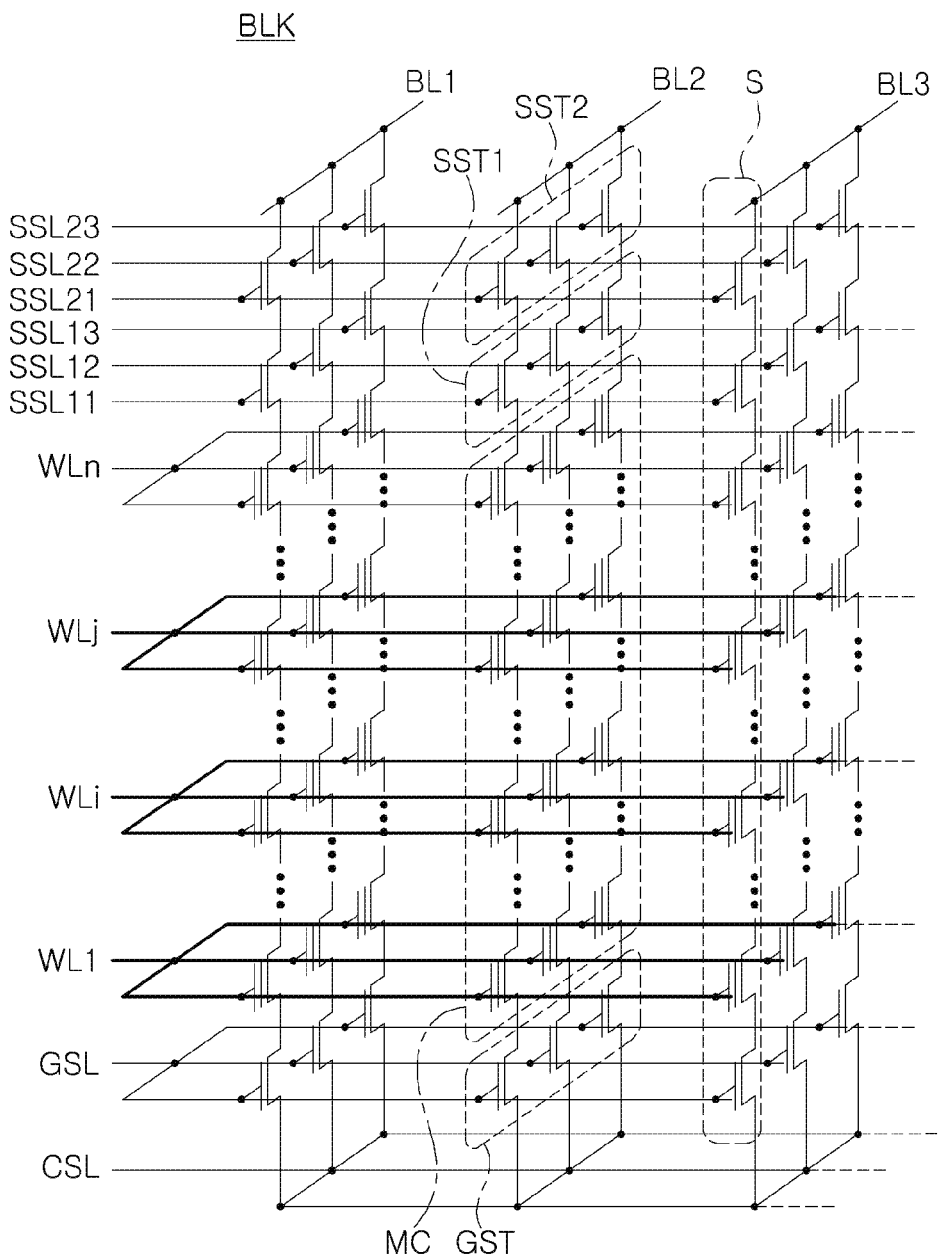
FIGS. 3 to 5 are circuit diagrams illustrating an operation of a memory device according to exemplary embodiments of the present inventive concept.
Figure 4:
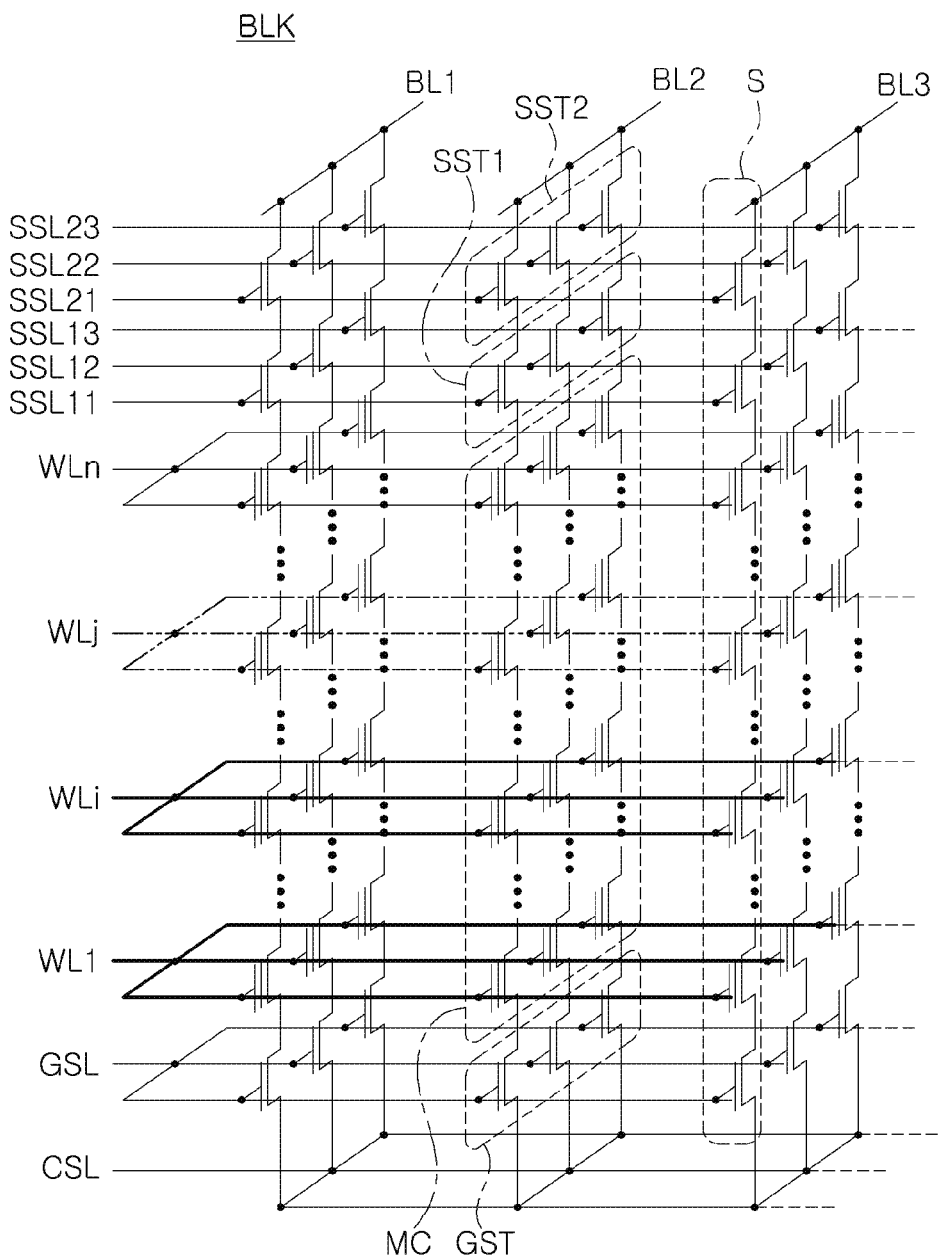
Figure 5:
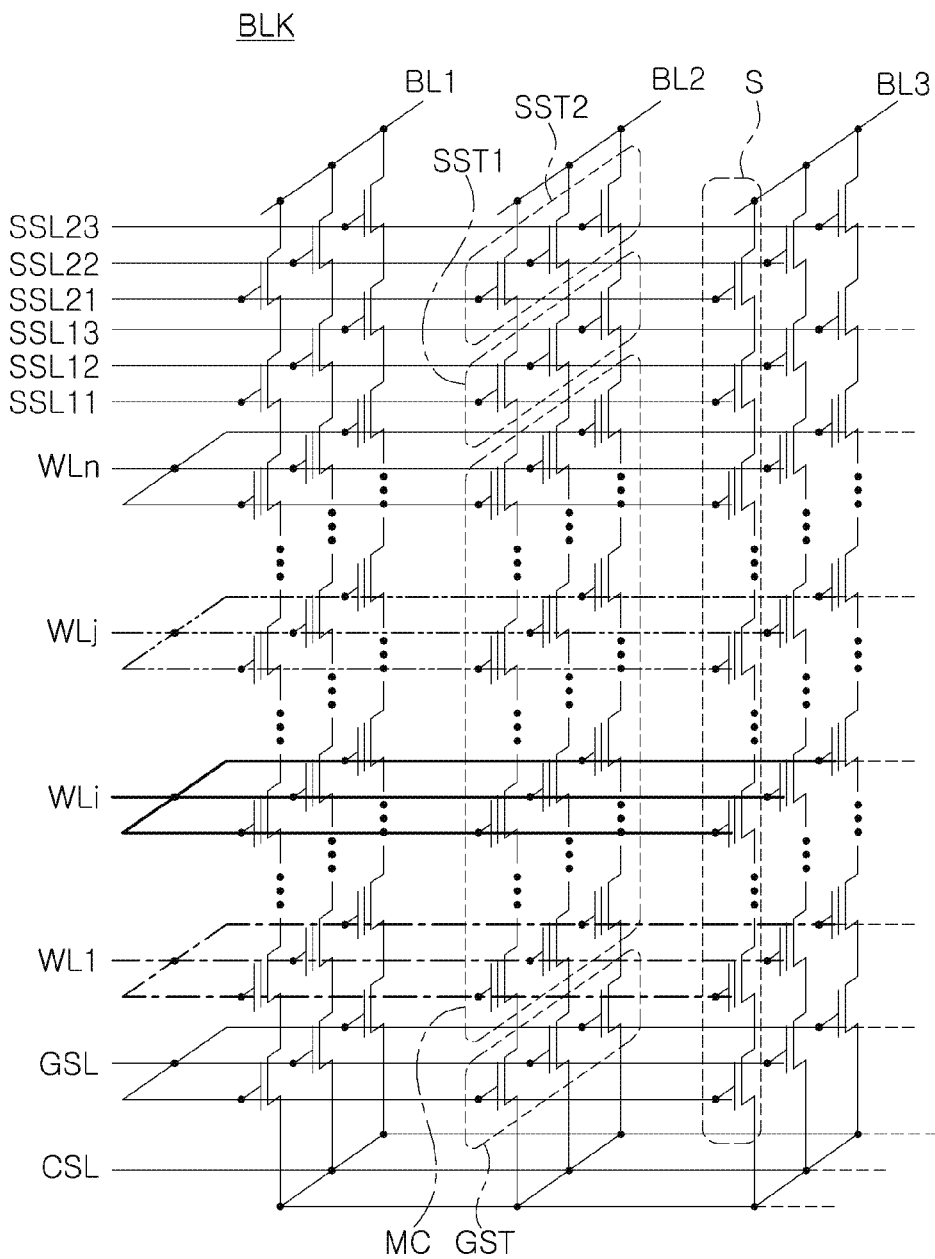

FIGS. 3 to 5 are circuit diagrams illustrating an operation of a memory device according to exemplary embodiments of the present inventive concept.

In an exemplary embodiment of the inventive concept illustrated in FIG. 3, only one-bit data may be stored in memory cells MC connected to a partial word line WLn, whereas data having two or more bits may be stored in memory cells MC connected to the other word lines WL1, WLi, and WLj. The memory cells MC connected to the partial word line WLn may operate as a single level cell (SLC), and the memory cells MC connected to the other word lines WL1, WLi, and WLj may operate as a multilevel cell (MLC), a triple level cell (TLC), a quad level cell (QLC), or the like.

In the exemplary embodiment illustrated in FIG. 3, memory cells MC in which only one-bit data is stored and memory cells MC in which data having two or more bits is stored may be determined in various manners. For example, data having two or more bits may be stored in memory cells MC connected to a word line having relatively low resistance in consideration of resistive properties of the word lines WL1 to WLn.

In an exemplary embodiment of the inventive concept illustrated in FIG. 4, one-bit data may be stored in memory cells MC connected to the partial word line WLn, and two-bit data may be stored in memory cells MC connected to a partial word line WLj. Data having three or more bits may be stored in memory cells MC connected to the other word lines WL1 and WLi. In the exemplary embodiment illustrated in FIG. 4, a single memory cell string S may include at least one memory cell MC operating as a single level cell, at least one memory cell MC operating as a multilevel cell, and at least one memory cell MC operating as a triple level cell.

In an exemplary embodiment of the inventive concept illustrated in FIG. 5, a single memory cell string S may include at least one memory cell MC operating as a single level cell, at least one memory cell MC operating as a multilevel cell, at least one memory cell MC operating as a triple level cell, and at least one memory cell MC operating as a quad level cell.

In the exemplary embodiments illustrated in FIGS. 3 to 5, the number of bits of data stored in each of the memory cells MC included in a single memory cell string S may be determined in accordance with properties of the memory cells MC. For example, when the word lines WL1 to WLn included in a single memory cell string S include a first word line, and a second word line having resistance lower than resistance of the first word line, the number of bits of data stored in a first memory cell connected to the first word line may be smaller than the number of bits of data stored in a second memory cell connected to the second word line. In an exemplary embodiment of the present inventive concept, a program speed of storing data in the first memory cell may be faster than a program speed of storing data in the second memory cell.

In an exemplary embodiment of the present inventive concept, a program operation and a reading operation may be performed by page unit, and a single page may be defined as a capacity of data storable in the memory cells MC connected to one or more word lines. A page may be determined in various manners depending on a memory device.

When a single memory cell string S includes the memory cells MC storing pieces of data having different numbers of bits, a page buffer may write or read out pieces of data corresponding to a single page or a plurality of pages in accordance with addresses of the memory cells MC to which a program operation and/or a reading operation is performed. For example, when a word line connected to memory cells MC operating as triple level cells is designated as an address, the page buffer may program data corresponding to three pages to memory cells MC connected to a single word line, or may read out the data from the memory cells MC.

In the exemplary embodiments illustrated in FIGS. 3 to 5, the number of times that memory cells MC storing data having a relatively smaller number of bits has been used may be different from the number of times that memory cells MC storing data having a relatively large number of bits has been used. In other words, a memory controller may determine the number of times that memory cells MC has been used, in accordance with the number of bits of data stored in the memory cells MC. For example, the memory controller may control the memory block BLK to configure the number of times that memory cells MC storing one-bit data has been used to be higher than or the same as the number of times that memory cells MC storing data having two or more bits has been used. In an exemplary embodiment of the present inventive concept, by frequently using memory cells MC expected to deteriorate relatively later due to a program operation, a reading operation, an erasing operation, or the like that is continuously performed, reliability of the memory device may improve and a lifespan of the memory device may be extended.

FIGS. 6 to 9 are diagrams illustrating an operation of a memory device according to exemplary embodiments of the present inventive concept.

Figure 6:
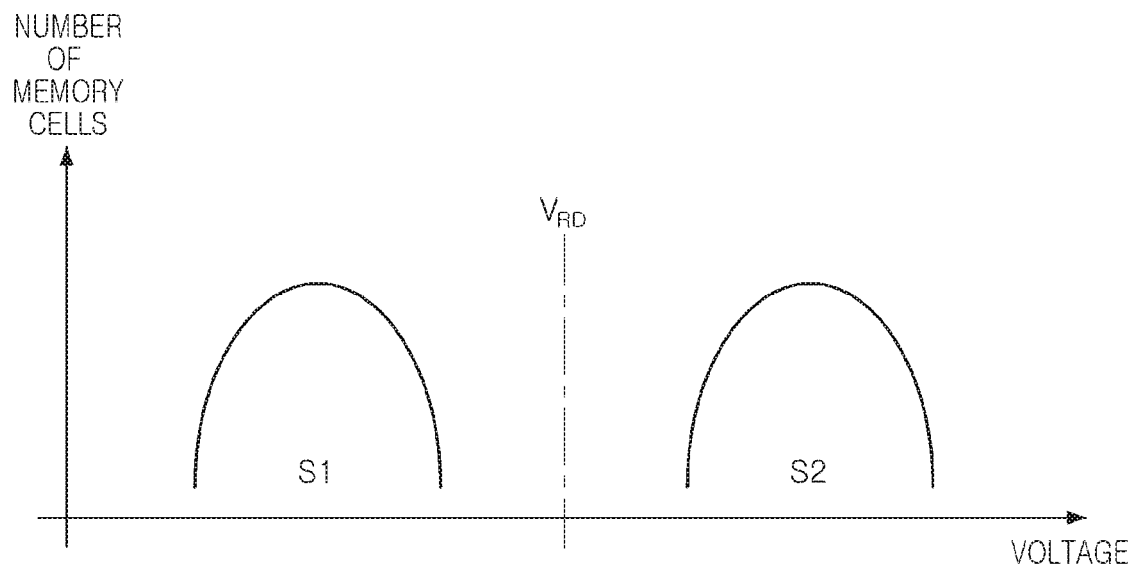
FIGS. 6 to 9 are diagrams illustrating an operation of a memory device according to exemplary embodiments of the present inventive concept.

FIGS. 6 to 9 are diagrams illustrating a distribution of threshold voltages of memory cells in accordance with the number of bits of data stored in each of the memory cells included in a memory device. FIG. 6 illustrates a distribution of threshold voltages of memory cells in which one-bit data is stored.

Referring to FIG. 6, the memory cells may have one of a first state S1 and a second state S2. The first state S1 may have a voltage lower than a voltage of the second state S2. In the exemplary embodiment illustrated in FIG. 6, a reading voltage $V_{RD}$ input to word lines by a memory controller to perform a reading operation may be a voltage between the first state S1 and the second state S2.

Figure 7:
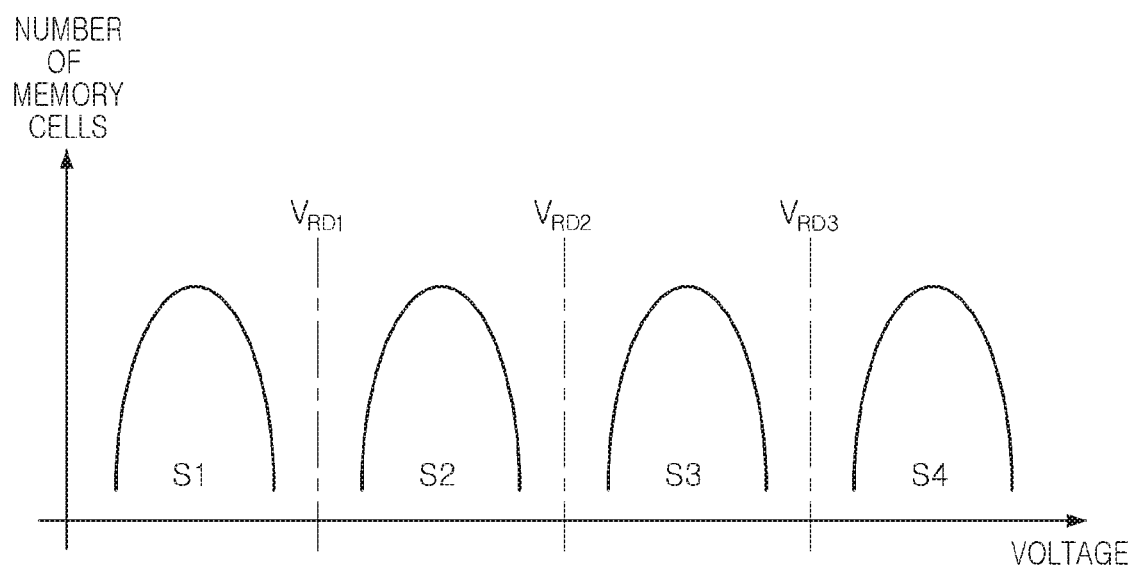

FIG. 7 is a diagram illustrating a distribution of threshold voltages of memory cells in each of which two-bit data is stored. In the exemplary embodiment in FIG. 7, the memory cells may have one of first to fourth states S1 to S4. A memory controller may input first to third reading voltages $V_{RD1}$ to $V_{RD3}$ among the first to fourth states S1 to S4 to word lines and may perform a reading operation. Additionally, the memory controller may also store two-bit data in each of the memory cells by performing a program operation numerous times.

Figure 8:
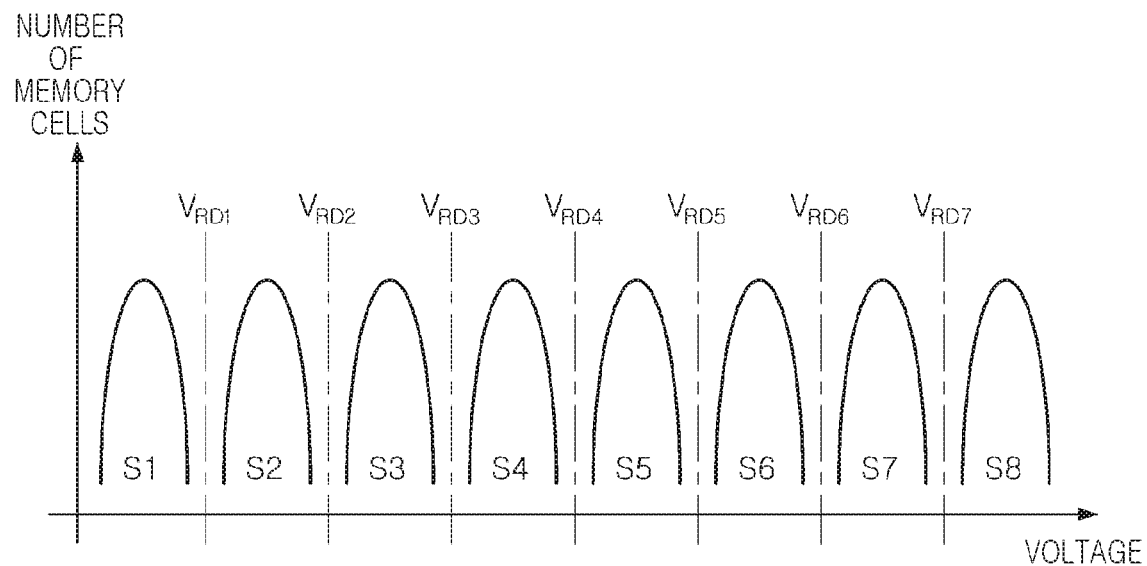

FIG. 8 illustrates distribution of threshold voltages of memory cells in each of which three-bit data is stored. In the exemplary embodiment in FIG. 8, the memory cells may have one of first to eighth states S1 to S8. A memory controller may input first to seventh reading voltages $V_{RD1}$ to $V_{RD7}$ among first to eight states S1 to S8 to word lines and may perform a reading operation.

Figure 9:
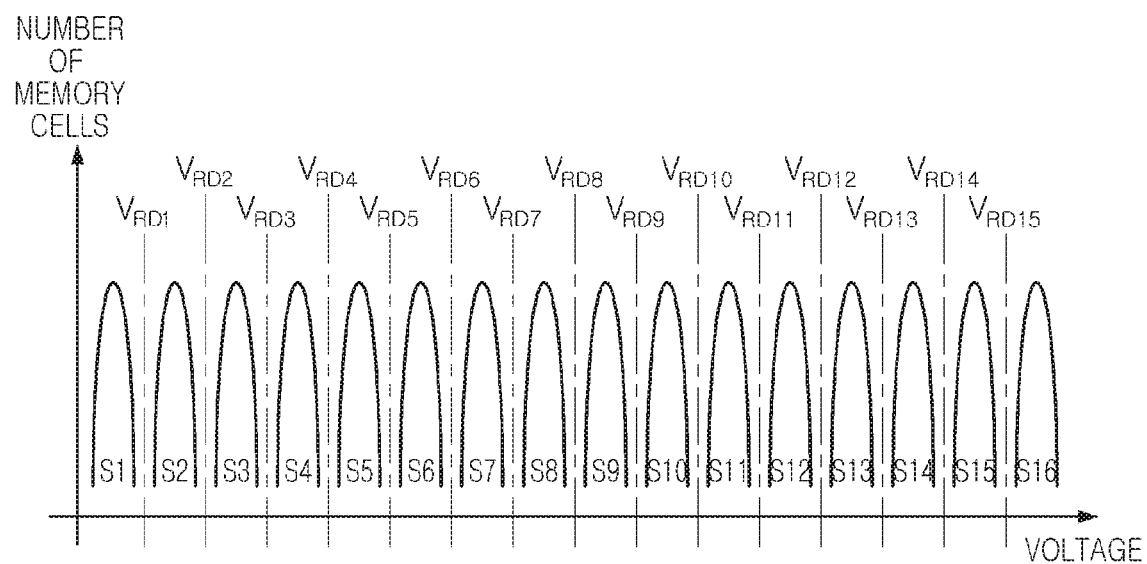

FIG. 9 illustrates distribution of threshold voltages of memory cells in each of which four-bit data is stored. In the exemplary embodiment in FIG. 9, the memory cells may have one of first to sixteenth states S1 to S16. A memory controller may input first to fifteenth reading voltages $V_{RD1}$ to $V_{RD15}$ among the first to sixteenth states S1 to S16 to word lines and may perform a reading operation.

Referring to FIGS. 6 to 9, the more the number of bits of data stored in each of the memory cells increases, the narrower the distribution of threshold voltages may be. Thus, when data having a large number of bits is stored in a memory cell having degraded properties, data may not be properly stored or an error may occur while reading data. In an exemplary embodiment of the present inventive concept, at least portions of memory cells included in a single memory cell string may be controlled to store pieces of data having different numbers of bits in consideration of properties of the memory cells. Accordingly, operation performance of the memory device, such as reliability, a lifespan, or the like of the memory device, may improve without sacrificing integration density, storage capacity, or the like of the memory device.

Figure 10:
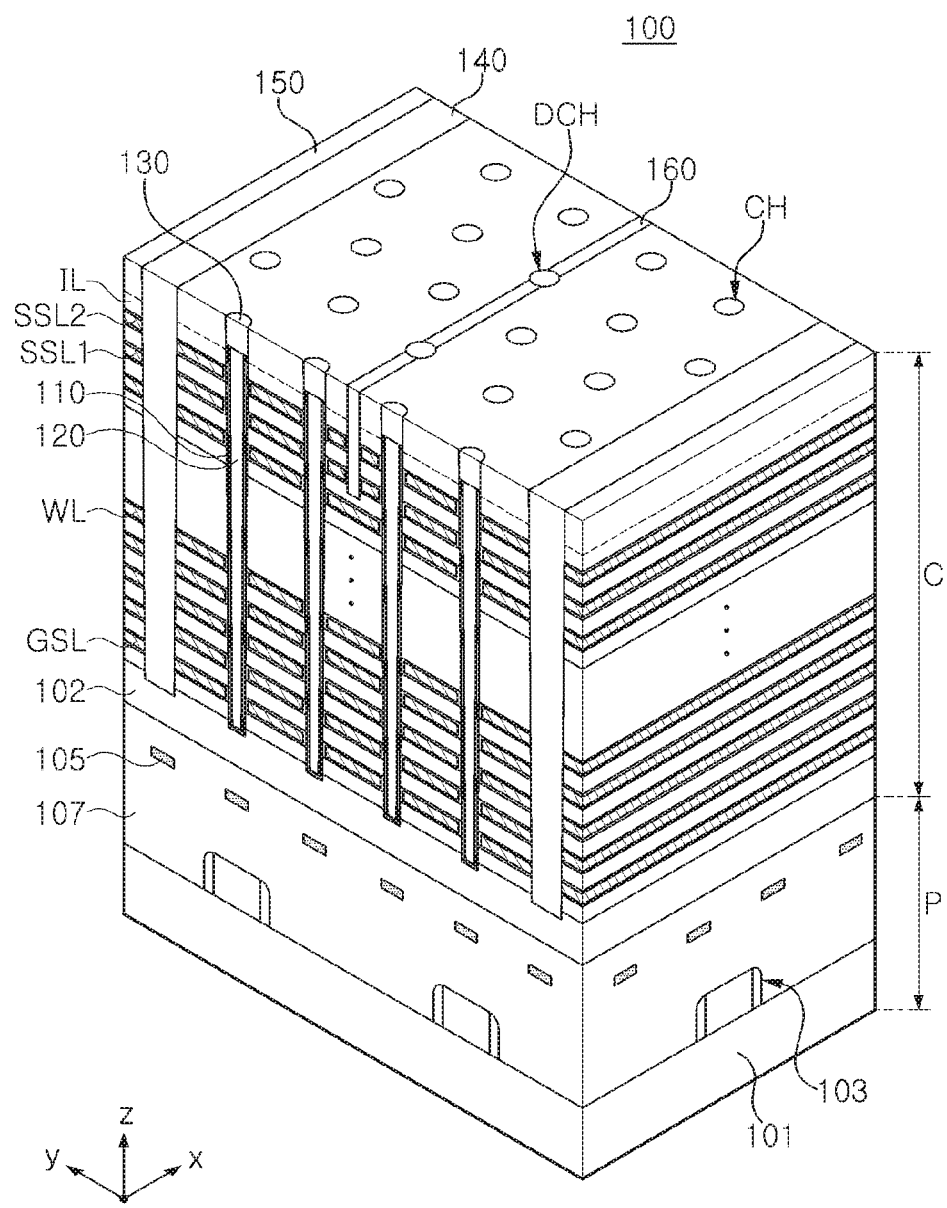
FIGS. 10 and 11 are diagrams illustrating a memory device according to exemplary embodiments of the present inventive concept.
Figure 11:
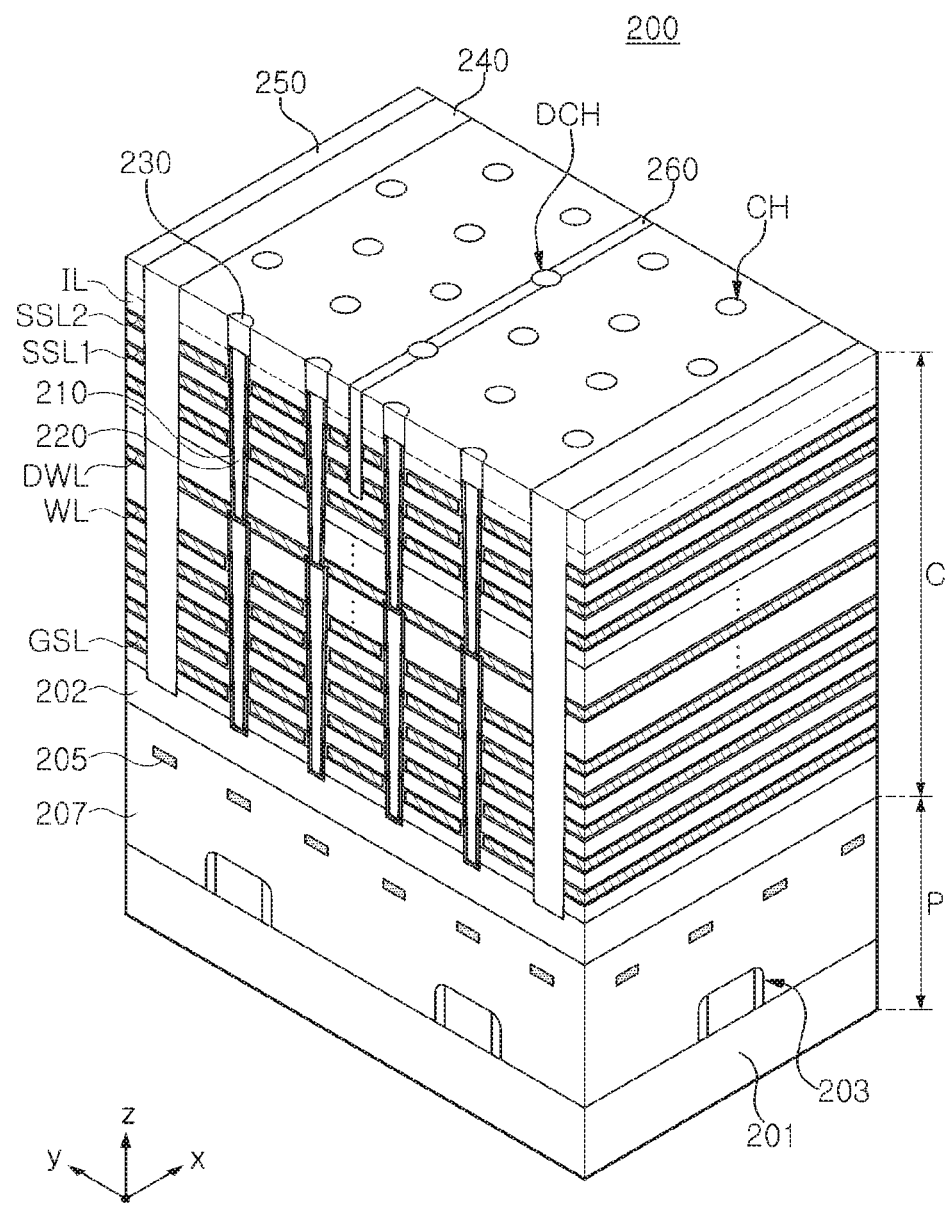

FIGS. 10 and 11 are diagrams illustrating a memory device according to exemplary embodiments of the present inventive concept.

FIGS. 10 and 11 are perspective diagrams illustrating memory devices 100 and 200, respectively, in accordance with exemplary embodiments of the present inventive concept. Referring to FIG. 10, the memory device 100 may include a cell region C and a peripheral circuit region P disposed in an upper portion and a lower portion, respectively. The peripheral circuit region P may be disposed in a lower portion of the cell region C, the peripheral circuit region P may include a first substrate 101, and the cell region C may include a second substrate 102 different from the first substrate 101.

For example, the peripheral circuit region P may include a plurality of peripheral circuit devices 103 disposed on the first substrate 101, a plurality of wiring lines 105 connected to the peripheral circuit devices 103, a first interlayer insulating layer 107 covering the peripheral circuit devices 103 and the wiring lines 105, and other elements. The peripheral circuit devices 103 included in the peripheral circuit region P may provide a circuit for driving the memory device 100, such as a page buffer, a row decoder circuit, or the like, as an example.

The second substrate 102 included in the cell region C may be disposed on the first interlayer insulating layer 107. The cell region C may include the ground select line GSL, the word lines WL, and string select lines SSL1 and SSL2, stacked on the second substrate 102, and a plurality of insulating layers IL. The insulating layers IL may be alternately stacked with the ground select line GSL, the word lines WL, and the string select lines SSL1 and SSL2. The number of the ground select line GSL and the number of the string select lines SSL1 and SSL2 may not be limited to the example illustrated in FIG. 10, and may be varied.

The cell region C may further include channel structures CH extending in a first direction (Z axis direction) perpendicular to an upper surface of the second substrate 102, and the channel structures CH may penetrate the ground select line GSL, the word lines WL, and the string select lines SSL1 and SSL2, and may be connected to the second substrate 102. The channel structures CH may include a channel region 110, a filling insulating layer 120 filling an internal space of the channel region 110, a bit line connecting layer 130, and other elements. Each of the channel structures CH may be connected to at least one bit line through the bit line connecting layer 130. The ground select line GSL, the word lines WL, the string select lines SSL1 and SSL2, the insulating layers IL, the channel structures CH, and other elements may be referred to as a stack structure.

At least one gate insulating layer may be disposed on an external side of the channel region 110. In an exemplary embodiment of the present inventive concept, the gate insulating layer may include a tunneling layer, an electric charge storage layer, a blocking layer, or the like. In exemplary embodiments of the present inventive concept, at least one of the tunneling layer, the electric charge storage layer, and the blocking layer may be configured to surround the ground select line GSL, the word lines WL, and the string select lines SSL1 and SSL2.

The ground select line GSL, the word lines WL, and the string select lines SSL1 and SSL2 may be covered by an interlayer insulating layer 150. Additionally, the ground select line GSL, the word lines WL, and the string select lines SSL1 and SSL2 may be divided into a plurality of regions by word-line cuts 140. In an exemplary embodiment of the present inventive concept, the string select lines SSL1 and SSL2 may be divided into a plurality of regions by a separation insulating layer 160 between a pair of the word-line cuts 140 adjacent to each other in a second direction (Y axis direction), substantially parallel to an upper surface of the second substrate 102.

In an exemplary embodiment of the present inventive concept, dummy channel structures DCH may be disposed in a region in which the separation insulating layer 160 is disposed. Each of the dummy channel structures DCH may have a structure that is substantially the same as a structure of each of the channel structures CH, and may not be connected to a bit line.

In the exemplary embodiment in FIG. 10, each of the channel structures CH and the word-line cuts 140 may have a shape extending in the first direction, and accordingly, a width of the shape may change in the first direction. Referring to FIG. 10, each of the channel structures CH and the word-line cuts 140 may have a tapered structure having a width decreasing towards the second substrate 102.

As each of the channel structures CH and the word-line cuts 140 has a tapered structure, resistive properties of each of the word lines WL may be varied depending on a height of each of the word lines WL. For example, a word line WL at a lowermost end may have a relatively large area as compared to a word line WL at an uppermost end, and the word line WL at the lowermost end may have relatively excellent resistive properties (e.g., relatively low resistance). Accordingly, a memory cell connected to the word line WL having relatively excellent resistive properties may have relatively excellent properties.

In an exemplary embodiment of the present inventive concept, pieces of data having different numbers of bits may be stored in memory cells in consideration of properties of the memory cells determined in accordance with the resistive properties of the word lines WL. For example, data having two or more bits may be stored in each of the memory cells connected to the word line WL at the lowermost end, and one-bit data may be stored in each of memory cells connected to the word line WL at the uppermost end. Accordingly, in an exemplary embodiment of the present inventive concept, at least portions of the memory cells included in a single memory cell string may store pieces of data having different numbers of bits.

The above-described configuration may indicate that the number of pages may be varied in accordance with a height of each of the word lines WL connected to the memory cells in which data is stored. For example, data of a single page may be stored in memory cells connected to the word line WL at the uppermost end, and data of two or more pages may be stored in memory cells connected to the word lines at the lowermost end. When capacity of a single page is 16 KB, 16 KB data may be stored in the memory cells connected to the word line WL at the uppermost end, whereas 32 KB data, 48 KB data, 64 KB data, or the like may be stored in the memory cells connected to the word lines at the lowermost end in the above-described configuration.

Referring to FIG. 11, the memory device 200 in an exemplary embodiment of the inventive concept may include the cell region C and the peripheral circuit region P disposed in an upper portion and a lower portion, respectively. The memory device 200 in the exemplary embodiment illustrated in FIG. 11 may have a structure similar to the structure of the memory device 100 in the exemplary embodiment illustrated in FIG. 10, and thus, descriptions of the elements which may be understood by FIG. 10 will not be provided.

In the exemplary embodiment in FIG. 11, to overcome difficulty in a process caused by an increase of the number of word lines WL, partial word lines WL may be stacked and a lower channel structure may be formed, and the other word lines WL may be stacked and an upper channel structure may be formed. Accordingly, each of the channel structures CH may include the upper channel structure and the lower channel structure as illustrated in FIG. 11. As an example, the lower channel structure and word lines penetrated by the lower channel structure may be referred to as a lower stack structure, and the upper channel structure and word lines penetrated by the upper channel structure may be referred to as an upper stack structure.

The lower channel structure may extend from a second substrate 202, and the upper channel structure may extend from the lower channel structure and may be connected to a bit line through a bit line connecting layer 230. In each of the channel structures CH, a channel region 210 of the upper channel structure and a channel region 210 of the lower channel structure may be connected to each other.

Each of the upper channel structure, the lower channel structure, and word-line cuts 240 may have a tapered structure having a width decreasing towards the second substrate 202 in the first direction (Z axis direction). In the exemplary embodiment in FIG. 11, as each of the upper channel structure and the lower channel structure has a tapered structure in each of the channel structures CH, resistive properties of the word lines WL may be different from the exemplary embodiment illustrated in FIG. 10. Accordingly, the number of bits of data stored in each of memory cells connected to the word lines WL in the exemplary embodiment in FIG. 10 may be determined differently from the number of bits of the data in the exemplary embodiment in FIG. 11.

Properties of a memory cell may be deteriorated in a region adjacent to a boundary at which the upper channel structure and the lower channel structure are connected to each other. Accordingly, a dummy word line DWL may be disposed in a region adjacent to the boundary. The dummy word line DWL may be connected to a dummy memory cell, and valid data may not be stored in the dummy memory cell.

Elements 201, 203, 205, 207, 220, 250, and 260 in FIG. 11 may be similar to elements 101, 103, 105, 107, 120, 150, and 160 in FIG. 10. Thus, descriptions thereof will be omitted.

Figure 12:
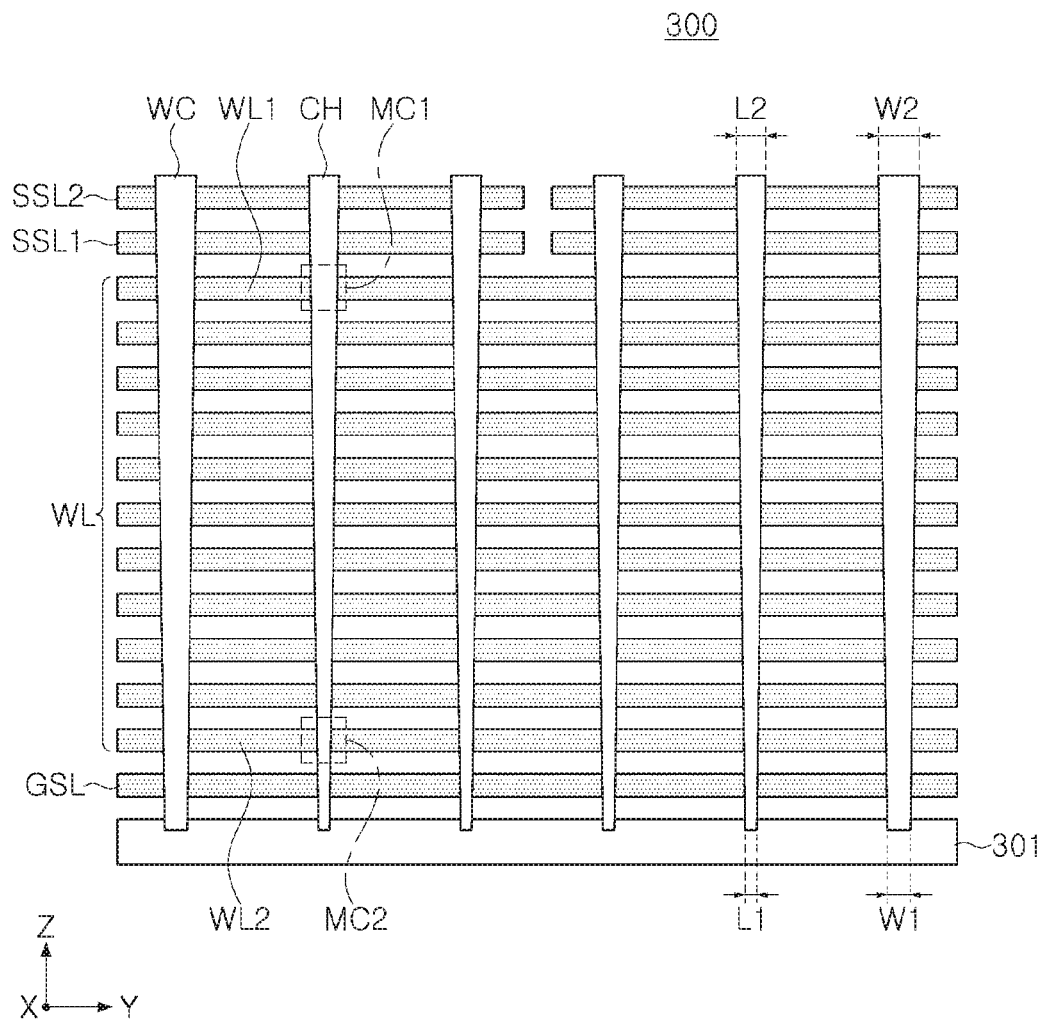
FIGS. 12 and 13 are diagrams illustrating an operation of a memory device according to exemplary embodiments of the present inventive concept.
Figure 13:
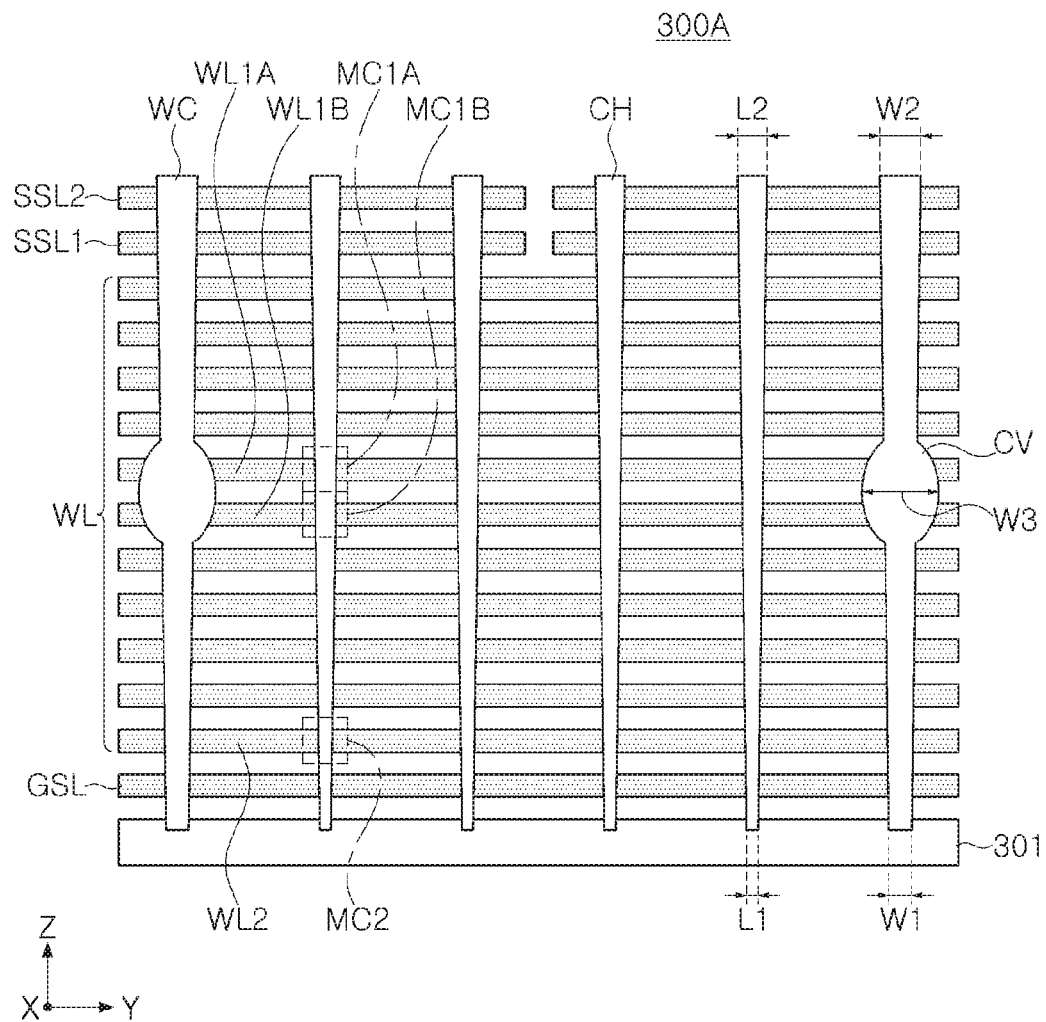

FIGS. 12 and 13 are diagrams illustrating an operation of a memory device according to exemplary embodiments of the present inventive concept.

Referring to FIG. 12, a memory device 300 in an exemplary embodiment of the inventive concept may include the ground select line GSL, the word lines WL, and the string select lines SSL1 and SSL2 stacked on an upper surface of a substrate 301. The ground select line GSL, the word lines WL, and the string select lines SSL1 and SSL2 may be divided into a plurality of regions by word-line cuts WC, and the string select lines SSL1 and SSL2 may be divided into a plurality of regions between a pair of the word-line cuts WC. The number of the ground select line GSL and the number of the string select lines SSL1 and SSL2 may be varied.

The ground select line GSL, the word lines WL, and the string select lines SSL1 and SSL2 may be penetrated by the channel structures CH. Each of the channel structures CH and the word-line cuts WC may have a width decreasing towards an upper surface of the substrate 301. As an example, a lower width L1 of each of the channel structures CH may be less than an upper width L2 thereof. In each of the word-line cuts WC, a lower width W1 may be smaller than an upper width W2. Accordingly, a size of an area of each of the word lines WL in a direction parallel to an upper surface of the substrate 301 may be varied in accordance with a height of each of the word lines WL, and resistive properties of the word lines WL may be varied.

Resistive properties of the word lines WL may affect properties of memory cells connected to the word lines WL. In an exemplary embodiment of the present inventive concept, capacity of data stored in the memory cells connected to the word lines WL, may be determined in consideration of a difference in properties of the memory cells caused by resistive properties or the like of the word lines WL.

Referring to FIG. 12, the word lines WL may include a first word line WL1 and a second word line WL2, and the first word line WL1 and the second word line WL2 may be disposed in different positions in the first direction (the Z axis direction). In the exemplary embodiment in FIG. 12, the first word line WL1 may be disposed above the second word line WL2, and the first word line WL1 may have a resistance higher than resistance of the second word line WL2. Accordingly, a first memory cell MC1 connected to the first word line WL1 may have properties more degraded than properties of a second memory cell MC2 connected to the second word line WL2. In an exemplary embodiment of the present inventive concept, the first memory cell MC1 may have threshold voltage distribution properties more degraded than that of the second memory cell MC2.

In an exemplary embodiment of the present inventive concept, N-bit data may be stored in the first memory cell MC1, and M-bit data may be stored in the second memory cell MC2. Both "M" and "N" may be natural numbers, and M may be greater than N. As an example, the first memory cell MC1 may operate as a single level cell, and the second memory cell MC2 may operate as a multilevel cell, a triple level cell, or a quad level cell. Alternatively, the first memory cell MC1 may operate as a multilevel cell, and the second memory cell MC2 may operate as a triple level cell or a quad level cell. In other words, in a single memory cell string, the number of bits of data stored in the first memory cell MC1 may be smaller than the number of bits of data stored in the second memory cell MC2.

Referring to FIG. 13, a protruding region CV may appear in the word-line cuts WC of a memory device 300A in an exemplary embodiment of the present inventive concept. For example, at least one of the word-line cuts WC may include a first taper region extending from the upper surface of the substrate 301 to the protruding region CV, and a second taper region extending from the protruding region CV. A width of each of the first taper region and the second taper region may be reduced closer to the substrate 301. Alternatively, the protruding region CV may appear only in a portion of the word-line cuts WC included in the memory device 300A. The protruding region CV may appear as a convex side surface and is formed while the ground select line GSL, the word lines WL, and the string select lines SSL1 and SSL2 are etched to form the word-line cuts WC. As an example, a width W3 of the protruding region CV may be the same as or greater than the upper width W2 of each of the word-line cuts WC.

First word lines WL1A and WL1B adjacent to the protruding region CV in the second direction (Y axis direction) may have a resistance relatively higher than a resistance of the other word lines WL. Accordingly, in an exemplary embodiment of the present inventive concept, data having relatively low capacity may be stored in first memory cells MC1A and MC1B connected to the first word lines WL1A and WL1B, respectively, adjacent to the protruding region CV. As an example, each of the first memory cells MC1A and MC1B may operate as a single level cell, and data having two or more bits may be stored in the second memory cell MC2 connected to the second word line WL2 having relatively low resistance.

FIGS. 14 to 18 are diagrams illustrating an operation of a memory device according to exemplary embodiments of the present inventive concept.

In memory devices 400, 400A, 400B, 400C, and 400D in the exemplary embodiments illustrated in FIGS. 14 to 18, each of the channel structures CH may include a lower channel structure LCH extending from a substrate 401, and an upper channel structure UCH connected to the lower channel structure LCH. The lower channel structure LCH may penetrate lower word lines LWL, and may provide lower memory cells. The upper channel structure UCH may penetrate upper word lines UWL, and may provide upper memory cells. In the exemplary embodiments illustrated in FIGS. 14 to 18, the number of the lower word lines LWL may be the same as the number of the upper word lines UWL, but the inventive concept is not limited thereto. The number of the lower word lines LWL and the number of the upper word lines UWL may be different from each other, and may be varied.

Figure 14:
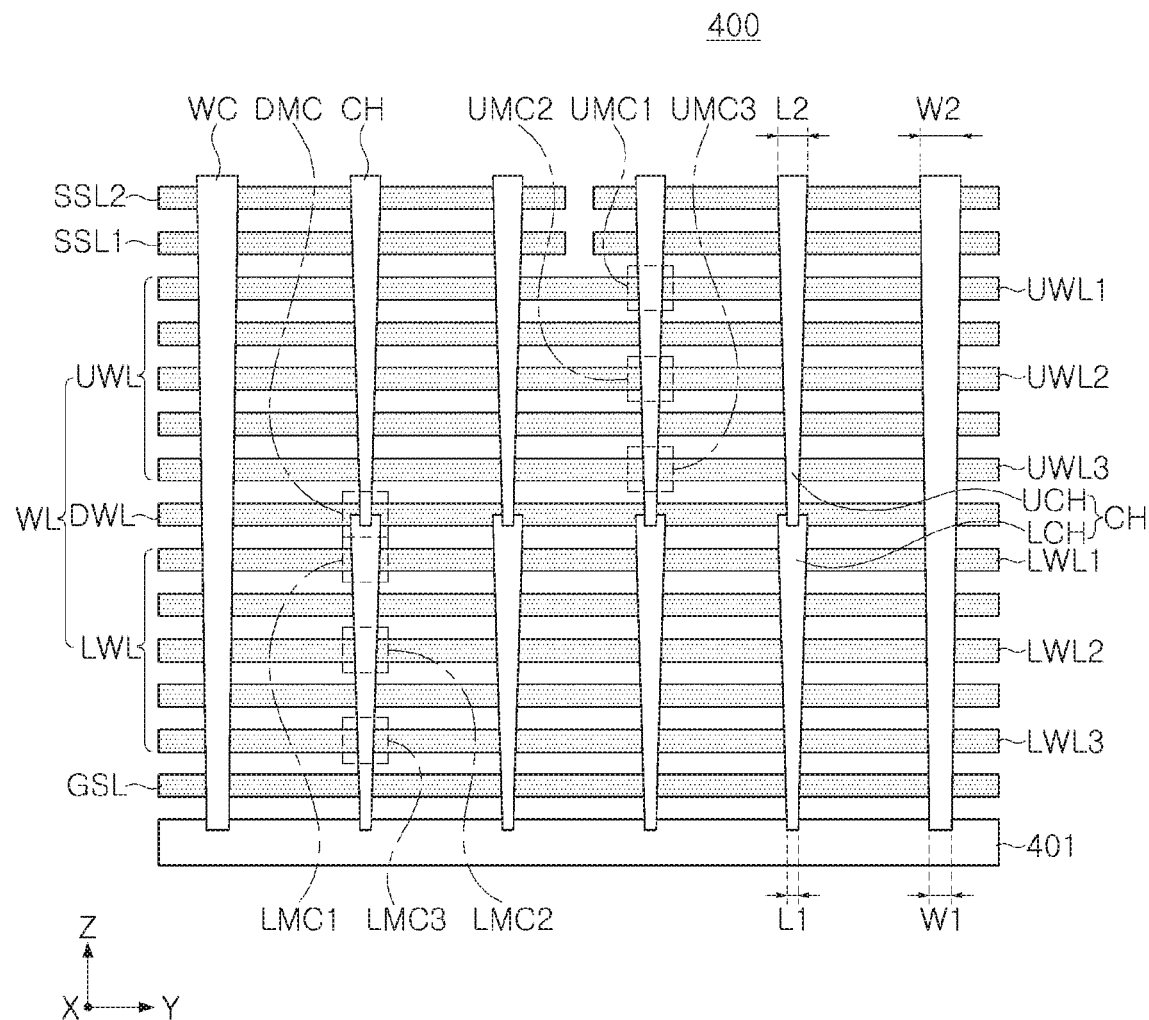
FIGS. 14 to 18 are diagrams illustrating an operation of a memory device according to exemplary embodiments of the present inventive concept.

Referring to FIG. 14, in the memory device 400 in the exemplary embodiment of the present inventive concept, the word-line cuts WC may be formed all together. Accordingly, a height of each of the word-line cuts WC may be higher than a height of the lower channel structure LCH or the upper channel structure UCH. Additionally, side surfaces of the channel structures CH and the word-line cuts WC may have different profiles.

Lower memory cells may include first to third lower memory cells LMC1 to LMC3 connected to first to third lower word lines LWL1 to LWL3, respectively. As an example, resistance of the second lower word line LWL2 may be higher than resistance of the third lower word line LWL3, and may be smaller than resistance of the first lower word line LWL1. Accordingly, the first lower memory cells LMC1 may have properties relatively more degraded than properties of the second lower memory cell LMC2, and the third lower memory cells LMC3 may have properties relatively more excellent than properties of the second lower memory cell LMC2. In an exemplary embodiment of the present inventive concept, each of the first lower memory cells LMC1 may operate as a single level cell, each of the second lower memory cells LMC2 may operate as a multi-level cell, and each of the third lower memory cells LMC3 may operate as a triple level cell.

Upper memory cells may include first to third upper memory cells UMC1 to UMC3 connected to first to third upper word lines UWL1 to UWL3, respectively. Similar to the lower memory cells, the first upper memory cell UMC1 may have relatively degraded properties, and the third upper memory cell UMC3 may have relatively excellent properties. The second upper memory cell UMC2 may have intermediate properties. Each of the first upper memory cell UMC1 may operate as a single level cell, each of the second upper memory cells UMC2 may operate a multilevel cell, and each of the third upper memory cells UMC3 may operate as a triple level cell.

The word lines WL may include at least one dummy word line DWL, and the dummy word line DWL may be connected to a dummy memory cell DMC. In the exemplary embodiment in FIG. 14, the dummy word line DWL may be adjacent to a boundary on which the upper channel structure UCH and the lower channel structure LCH are connected to each other.

An operation of the memory device 400 may be different from the above-described example. For example, the third upper memory cell UMC3 and the first upper memory cell UMC1 adjacent to the boundary on which the upper channel structure UCH and the lower channel structure LCH are connected to each other may operate as dummy memory cells. Additionally, the number of each of the first to third lower memory cells LMC1 to LMC3 and the number of bits of data stored in each of the first to third lower memory cells LMC1 to LMC3 may be varied.

Figure 15:
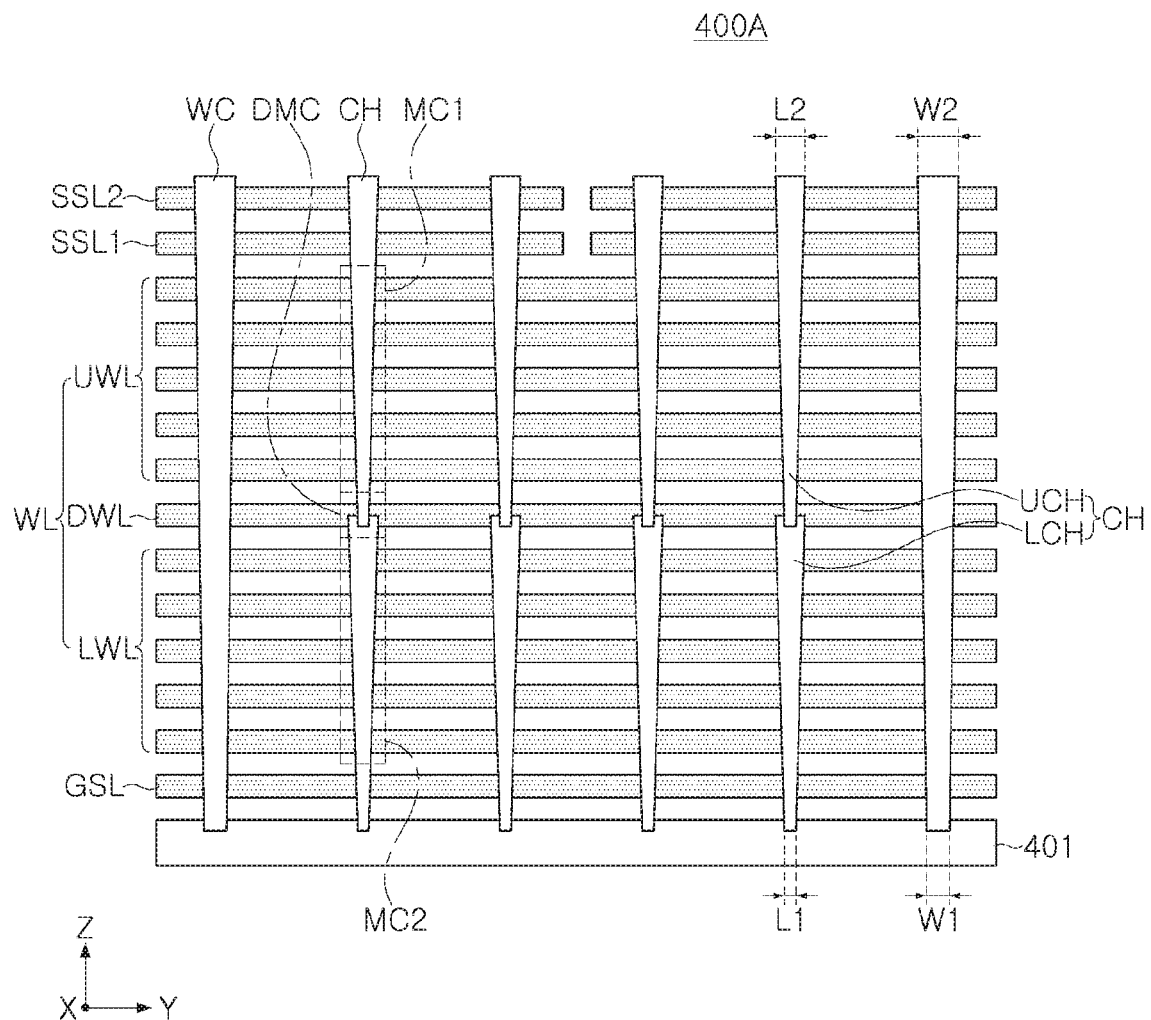

In the memory device 400A in the exemplary embodiment illustrated in FIG. 15, upper memory cells connected to the upper word lines UWL may be referred to as first memory cells MC1, and lower memory cells connected to the lower word lines LWL may be referred to as second memory cells MC2.

Each of the word-line cuts WC may have a width decreasing towards a substrate 401, and accordingly, the lower word lines LWL may have a resistance relatively lower than a resistance of the upper word lines UWL. Accordingly, the number of bits of data stored in each of the first memory cells MC1 may be smaller than the number of bits of data stored in each of the second memory cells MC2. Accordingly, in the exemplary embodiment in FIG. 15, capacity of data storable in the lower memory cells may be higher than capacity of data storable in the upper memory cells.

Figure 16:
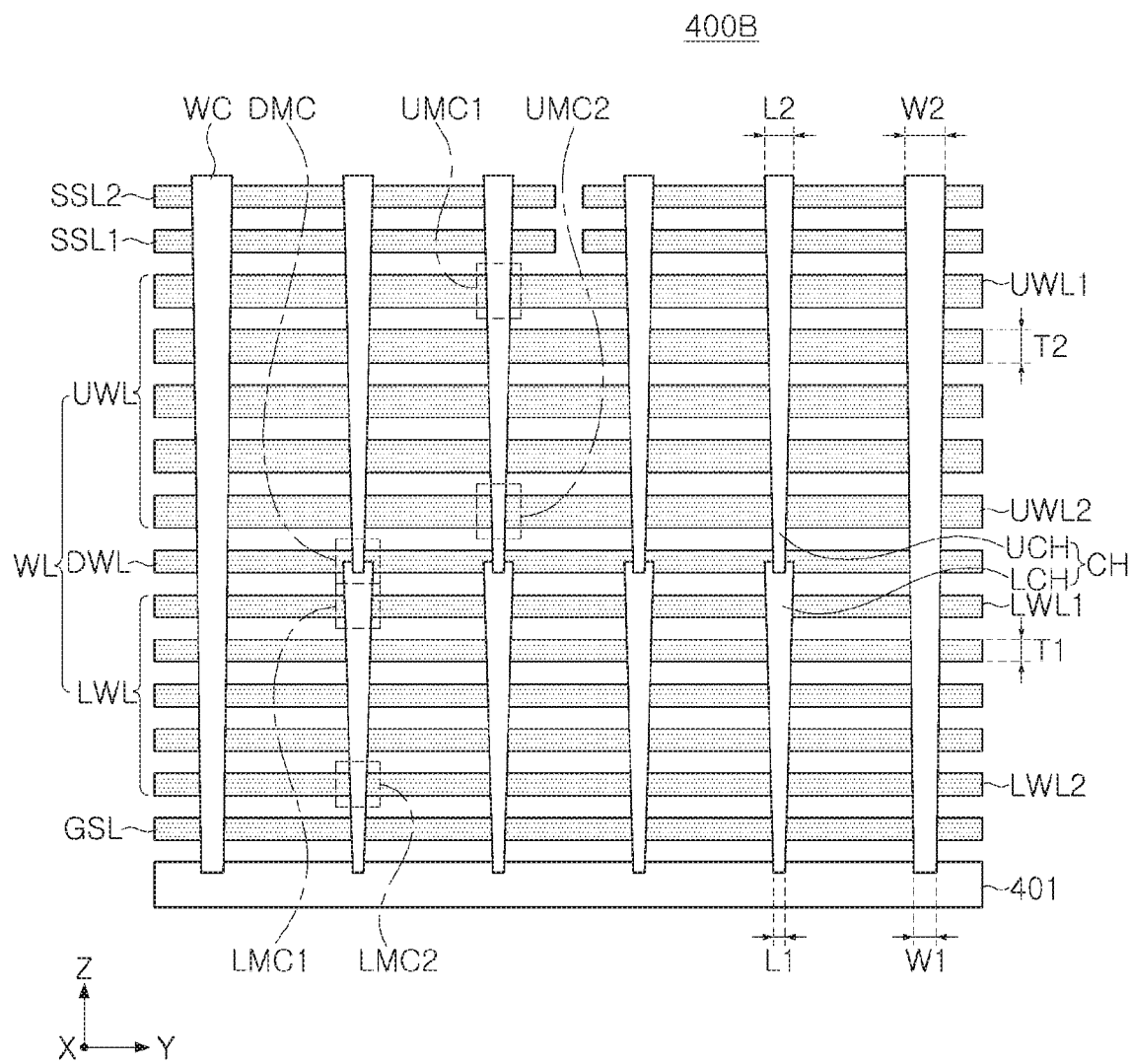

In the memory device 400B in the exemplary embodiment illustrated in FIG. 16, a thickness T1 of each of the lower word lines LWL may be smaller than a thickness T2 of each of the upper word lines UWL. Accordingly, an increase in resistance of the upper word lines UWL caused by the word-line cuts WC, each having a tapered structure, may be at least partially offset by an increase of the thickness T2, and pieces of data having two or more bits may be stored in at least one of the upper memory cells.

Referring to FIG. 16, the number of bits of data stored in the first upper memory cell UMC1 connected to the first upper word line UWL1 may be different from the number of bits of data stored in the second upper memory cell UMC2 connected to the second upper word line UWL2. Additionally, the number of bits of data stored in the first lower memory cell LMC1 connected to the first lower word line LWL1 may be different from the number of bits of data stored in the second lower memory cell LMC2 connected to the second lower word line LWL2.

In the exemplary embodiment illustrated in FIG. 16, as the thickness T2 of each of the upper word lines UWL may be configured to be greater than the thickness T1 of each of the lower word lines LWL, capacity of data stored in the upper memory cells may be greater than the example illustrated in FIG. 15. Additionally, as the thickness T2 of each of the upper word lines UWL increases, a height of the upper channel structure UCH may be higher than a height of the lower channel structure LCH. In exemplary embodiments of the present inventive concept, different from the example illustrated in FIG. 16, only portions of the upper word lines UWL, which may be expected to have degraded resistive properties, may have a thickness greater than a thickness of each of the lower word lines LWL. For example, a thickness of the first upper word line UWL1 at an uppermost end in which each of the word-line cuts WC has an increased thickness may be greater than a thickness of the second lower word line LWL2 at a lowermost end.

Figure 17:
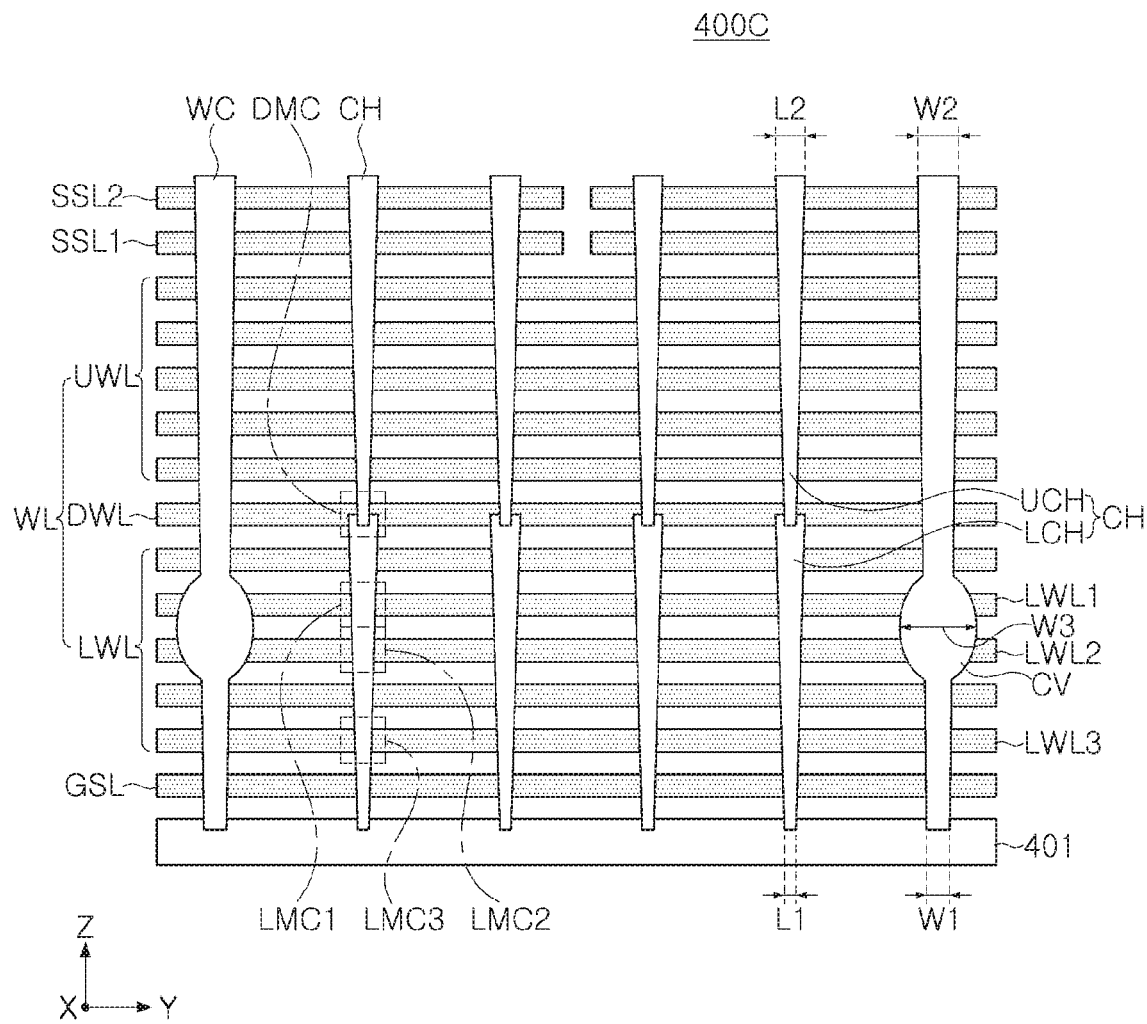

In the memory device 400C in the exemplary embodiment illustrated in FIG. 17, the word-line cuts WC may include the protruding region CV. The protruding region CV may appear in only portions of the word-line cuts WC included in the memory device 400C. The protruding region CV may appear as a convex side surface and is formed during an etch process to form the word-line cuts WC. As an example, the width W3 of the protruding region CV may be the same as or greater than the upper width W2 of each of the word-line cuts WC. In the exemplary embodiment in FIG. 17, the protruding region CV may appear on a level on which the lower word lines LWL are stacked, but the inventive concept is not limited thereto. For example, the protruding region CV may also appear on a level on which the upper word lines UWL are stacked.

Referring to FIG. 17, the first and second lower word lines LWL1 and LWL2 adjacent to the protruding region CV may have relatively high resistance due to a decrease of areas thereof. Accordingly, the number of bits of data stored in each of the first and second lower memory cells LMC1 and LMC2 may be smaller than the number of bits of data stored in the third lower memory cell LMC3. Additionally, the first and second lower memory cells LMC1 and LMC2 may be defined as dummy memory cells.

Figure 18:
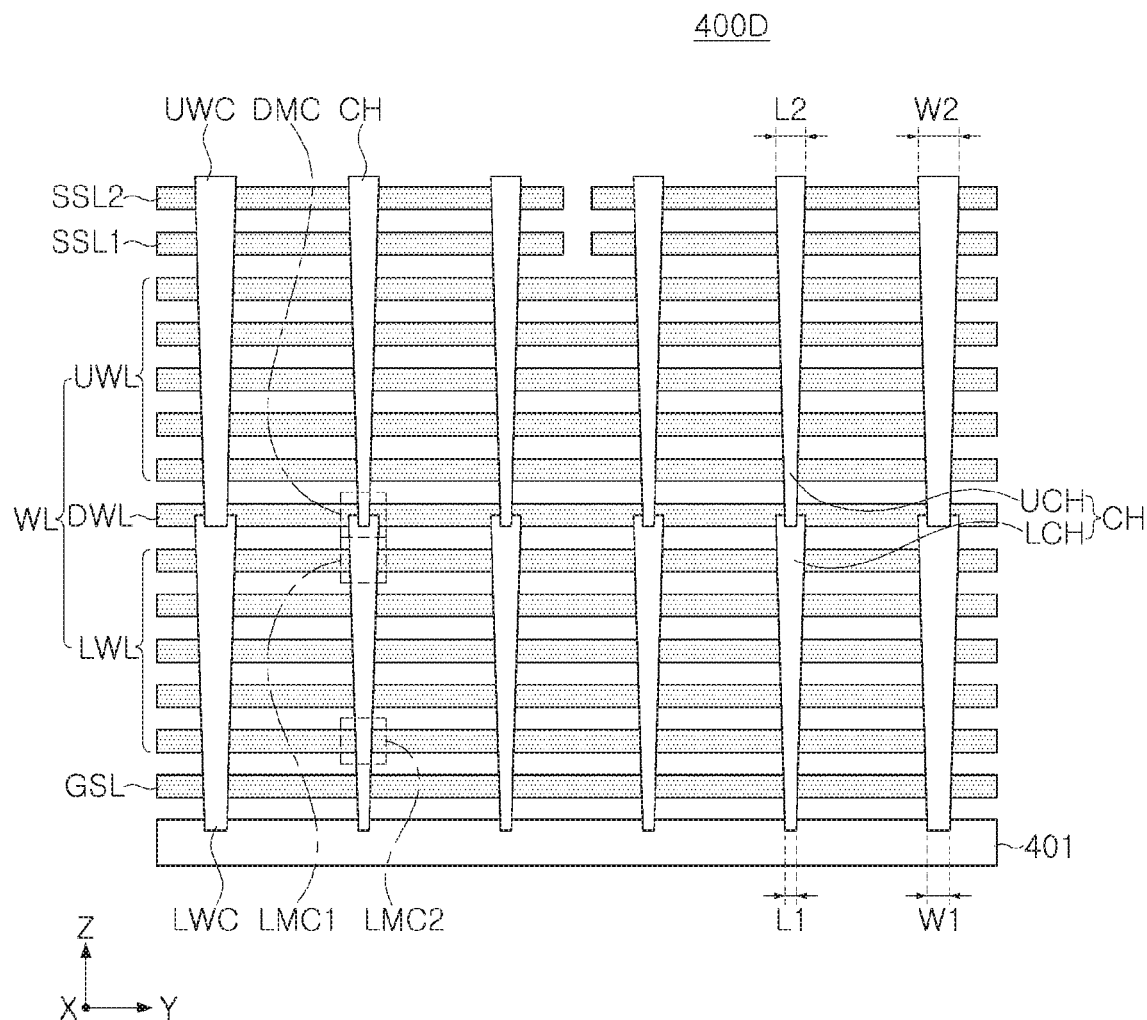

In the memory device 400D in the exemplary embodiment illustrated in FIG. 18, a word-line cut may include a lower word-line cut LWC and an upper word-line cut UWC. In the exemplary embodiment in FIG. 18, the lower word lines LWL may be stacked and the lower channel structure LCH and the lower word-line cut LWC may be formed, and the upper word lines UWL may be stacked and the upper channel structure UCH and the upper word-line cut UWC may be formed. In the exemplary embodiment illustrated in FIG. 18, a first boundary between the upper word lines UWL and the lower word-line cut LWC may be disposed on a level substantially the same as a second boundary between the upper channel structure UCH and the lower channel structure LCH. Alternatively, the first and second boundaries may be disposed on different levels. The first boundary and/or the second boundary may be adjacent to the dummy word line DWL providing the dummy memory cell DMC.

Similar to the exemplary embodiments described with reference to FIGS. 14 to 17, the memory cells LMC1 and LMC2 storing pieces of data having different numbers of bits may be included in a single memory cell string. In the exemplary embodiment in FIG. 18, the first lower memory cell LMC1 and the second lower memory cell LMC2 of the lower memory cells provided by the lower channel structure LCH may store pieces of data having different numbers of bits. As an example, the first lower memory cell LMC1 may store data having a number of bits smaller than a number of bits of data stored in the second lower memory cell LMC2. Additionally, at least portions of the upper memory cells may store pieces of data having different numbers of bits.

The configurations of the memory devices 400, 400A, 400B, 400C, and 400D described with reference to FIGS. 14 to 18 may be interchangeably applied. For example, the configuration of the exemplary embodiment in FIG. 16 in which each of the upper word lines UWL may have a thickness greater than a thickness of each of the lower word lines LWL may also be applied to the exemplary embodiment in FIG. 17. Additionally, the protruding region CV illustrated in FIG. 17 may appear in at least one of the lower word-line cut LWC and the upper word-line cut UWC described with reference to FIG. 18.

FIGS. 19 to 25 are diagrams illustrating an operation of a memory device according to exemplary embodiments of the present inventive concept.

In memory devices 500, 500A, 500B, and 500C in the exemplary embodiments illustrated in FIGS. 19 to 25, each of the channel structures CH may include the lower channel structure LCH extending from a substrate 501, an intermediate channel structure MCH connected to the lower channel structure LCH, and the upper channel structure UCH connected to the intermediate channel structure MCH. The lower channel structure LCH may penetrate the lower word lines LWL and may provide lower memory cells. The intermediate channel structure MCH may penetrate intermediate word lines MWL and may provide intermediate memory cells. The upper channel structure UCH may penetrate the upper word lines UWL and may provide upper memory cells.

In the exemplary embodiments illustrated in FIGS. 19 to 25, the number of the lower word lines LWL, the number of the intermediate word lines MWL, and the number of the upper word lines UWL may be the same, but the inventive concept is not limited thereto. The number of the lower word lines LWL, the number of the intermediate word lines MWL, and the number of the upper word lines UWL may be different from one another, and may be varied. The word lines WL may include dummy word lines DWL1 and DWL2, and the dummy word lines DWL1 and DWL2 may be connected to dummy memory cells DMC1 and DMC2. As an example, the first dummy word line DWL1 may be adjacent to a boundary on which the upper channel structure UCH and the intermediate channel structure MCH are connected to each other, and the second dummy word line DWL2 may be adjacent to a boundary on which the intermediate channel structure MCH and the lower channel structure LCH are connected to each other.

Figure 19:
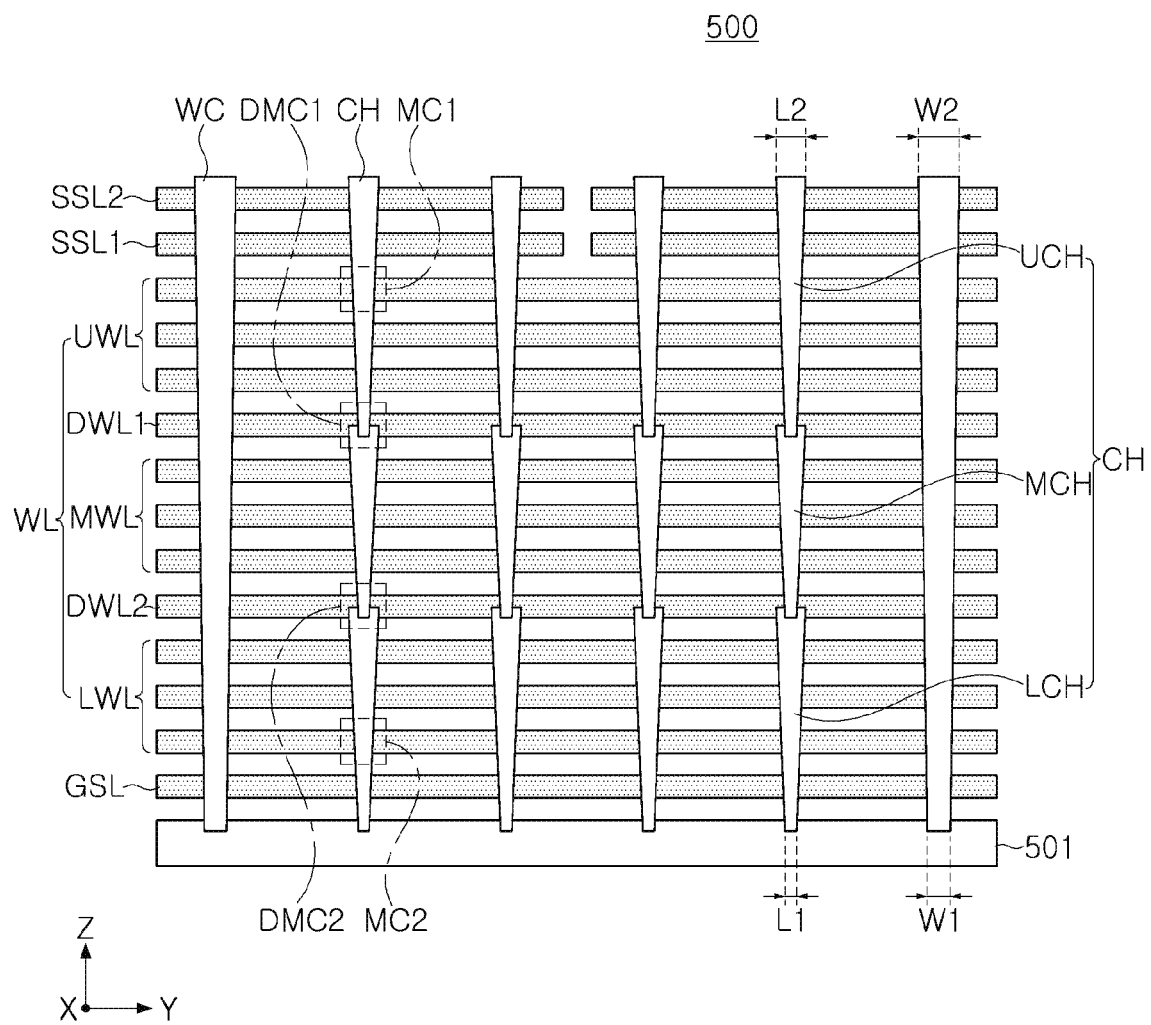
FIGS. 19 to 25 are diagrams illustrating an operation of a memory device according to exemplary embodiments of the present inventive concept.

In the memory device 500 in the exemplary embodiment of FIG. 19, the word-line cuts WC may be formed all together. Accordingly, side surfaces of the channel structures CH and the word-line cuts WC may have different profiles.

A single memory cell string may include the first memory cell MC1 and the second memory cell MC2. Pieces of data having different numbers of bits may be stored in the first memory cell MC1 and the second memory cell MC2. In an exemplary embodiment of the present inventive concept, the first memory cell MC1 may operate as a single level cell, and the second memory cell MC2 may operate as a multilevel cell, a triple level cell, or the like. Positions of the first memory cell MC1 and the second memory cell MC2 may not be limited to the example illustrated in FIG. 19, and may be varied depending on properties of the word lines WL.

As the word-line cuts WC are formed all together and the lower width W1 is smaller than the upper width W2, resistance of the upper word lines UWL may be higher than resistance of the intermediate word lines MWL and the lower word lines LWL. In an exemplary embodiment of the present inventive concept, to improve resistive properties, the upper word lines UWL may be configured to have a thickness greater than a thickness of each of the intermediate word lines MWL and/or the lower word lines LWL. In exemplary embodiments of the present inventive concept, each of the intermediate word lines MWL may have a thickness greater than a thickness of each of the lower word lines LWL. By configuring the thicknesses of the word lines WL to be different from one another, properties of the memory cells may improve such that the number of memory cells operating as single level cells may be reduced, and storage capacity of the memory device may increase.

Figure 20:
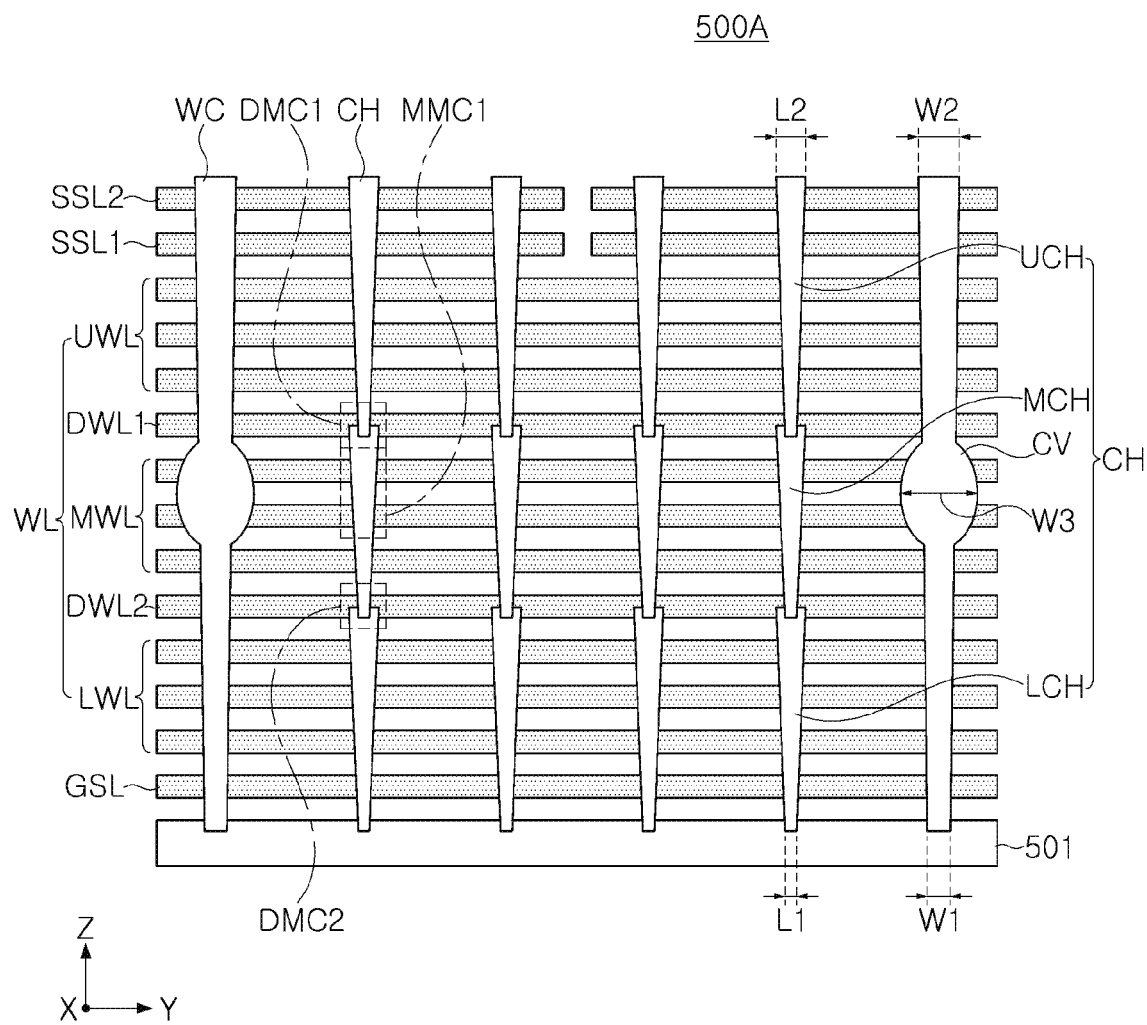

In the memory device 500A in the exemplary embodiment illustrated in FIG. 20, the word-line cuts WC may include the protruding region CV. The protruding region CV may appear only in portions of the word-line cuts WC included in the memory device 500A. The protruding region CV may appear as a convex side surface and is formed while the ground select line GSL, the word lines WL, and the string select lines SSL1 and SSL2 are etched to form the word-line cuts WC. As an example, the width W3 of the protruding region CV may be the same as or greater than the upper width W2 of each of the word-line cuts WC. In the exemplary embodiment in FIG. 20, the protruding region CV may appear on a level on which the intermediate word lines MWL are stacked, but the inventive concept is not limited thereto. For example, the protruding region CV may appear on a level on which the upper word lines UWL or the lower word lines LWL are stacked.

Figure 21:
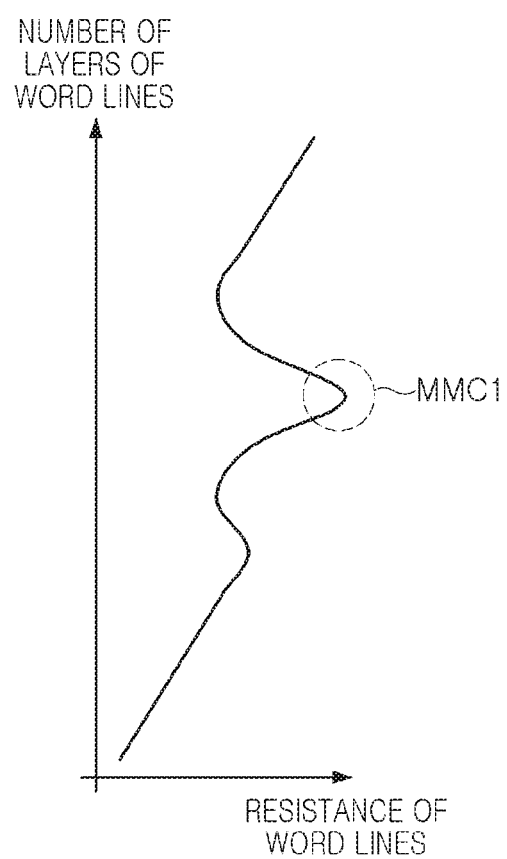

Referring to FIG. 20, first intermediate memory cells MMC1 may have relatively degraded properties due to an increase of resistance of the intermediate word lines MWL adjacent to the protruding region CV. Referring to FIG. 21, a graph illustrating resistance in accordance with the number of layers of the word lines, resistance of the intermediate word lines MWL may rapidly increase in the first intermediate memory cells MMC1, and accordingly, properties of the first intermediate memory cells MMC1 may degrade. In an exemplary embodiment of the present inventive concept, the first intermediate memory cells MMC1 adjacent to the protruding region CV may be allocated as dummy memory cells, or the first intermediate memory cells MMC1 may be controlled to operate as single level cells.

Figure 22:
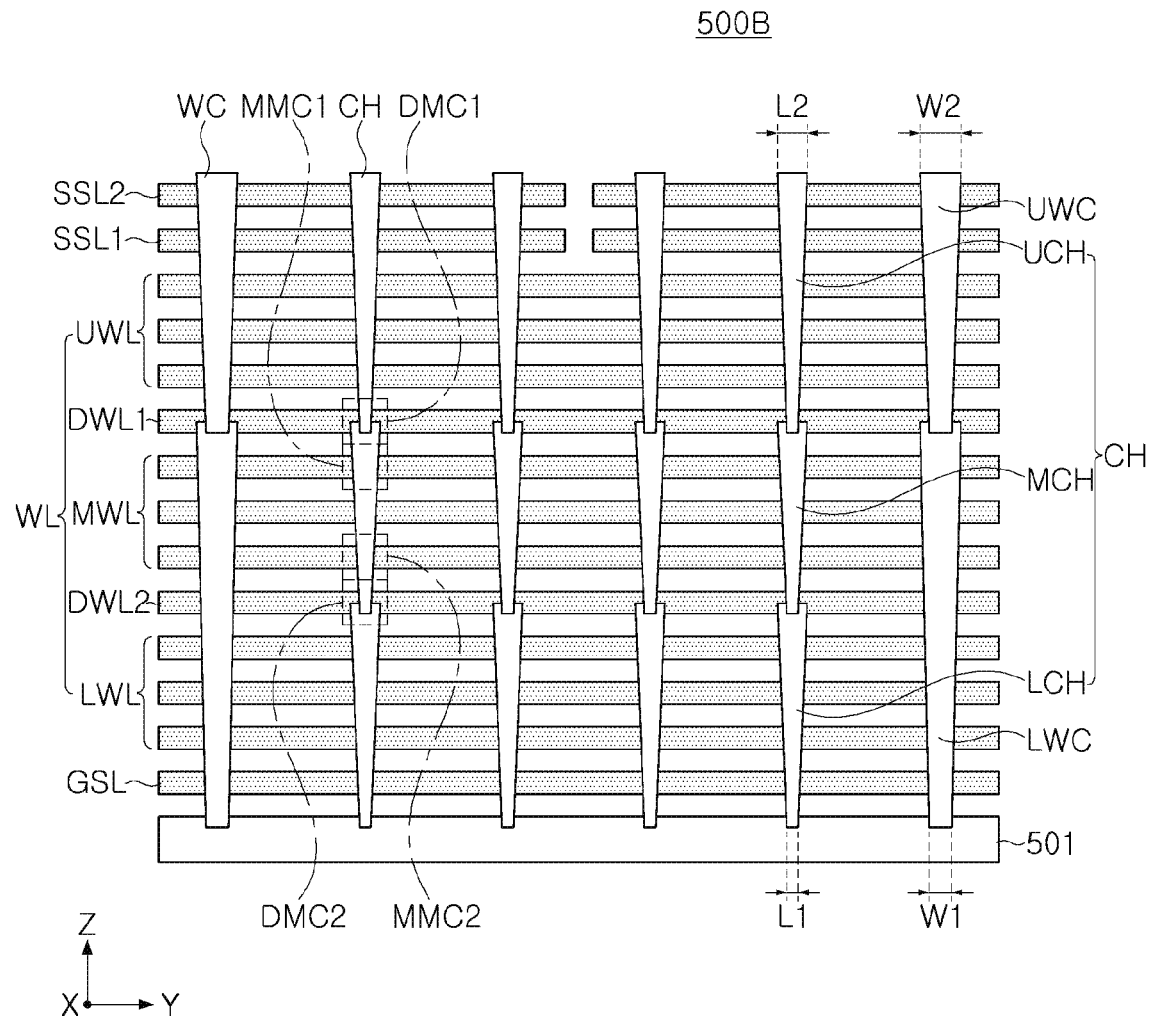

In the memory device 500B in the exemplary embodiment illustrated in FIG. 22, each of the word-line cuts WC may include the upper word-line cut UWC and the lower word-line cut LWC. A height of the lower word-line cut LWC may be greater than a height of the upper word-line cut UWC. For example, an upper surface of the lower word-line cut LWC may be disposed on a level substantially the same as upper surfaces of the intermediate word lines MWL. Different from the exemplary embodiment in FIG. 22, a height of the lower word-line cut LWC may be smaller than a height of the upper word-line cut UWC.

Figure 23:
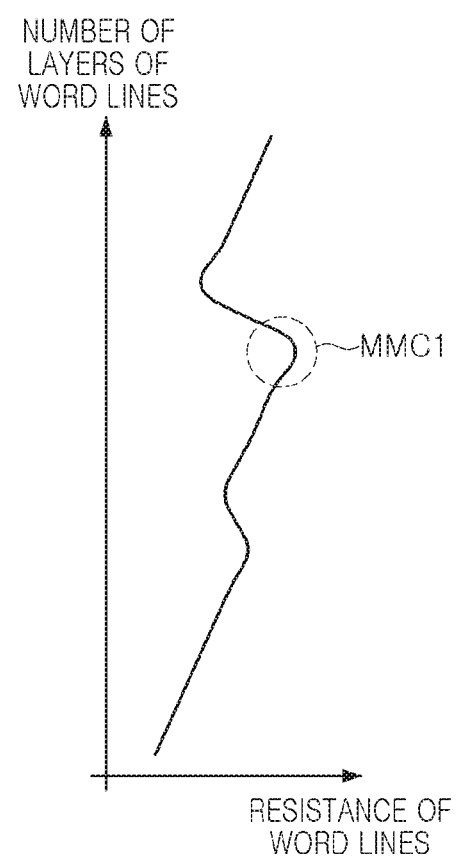

As the lower word-line cut LWC extends from the substrate 501 and may penetrate the lower word lines LWL and the intermediate word lines MWL, resistance of the intermediate word lines MWL may be relatively higher than resistance of the lower word lines LWL. Referring to the graph in FIG. 23, resistance of the lower word lines LWL and the intermediate word lines MWL may tend to gradually increase from the substrate 501, other than in a region adjacent to a boundary between the lower channel structure LCH and the intermediate channel structure MCH. Referring to FIG. 23, resistance of the intermediate word lines MWL may increase towards a boundary between the upper word-line cut UWC and the lower word-line cut LWC.

In the exemplary embodiment in FIG. 22, the first intermediate memory cell MMC1 may operate as a single level cell, or the first intermediate memory cell MMC1 may be allocated as a dummy memory cell. A second intermediate memory cell MMC2 may operate as a multilevel cell, a triple level cell, a quad level cell, or the like.

Figure 24:
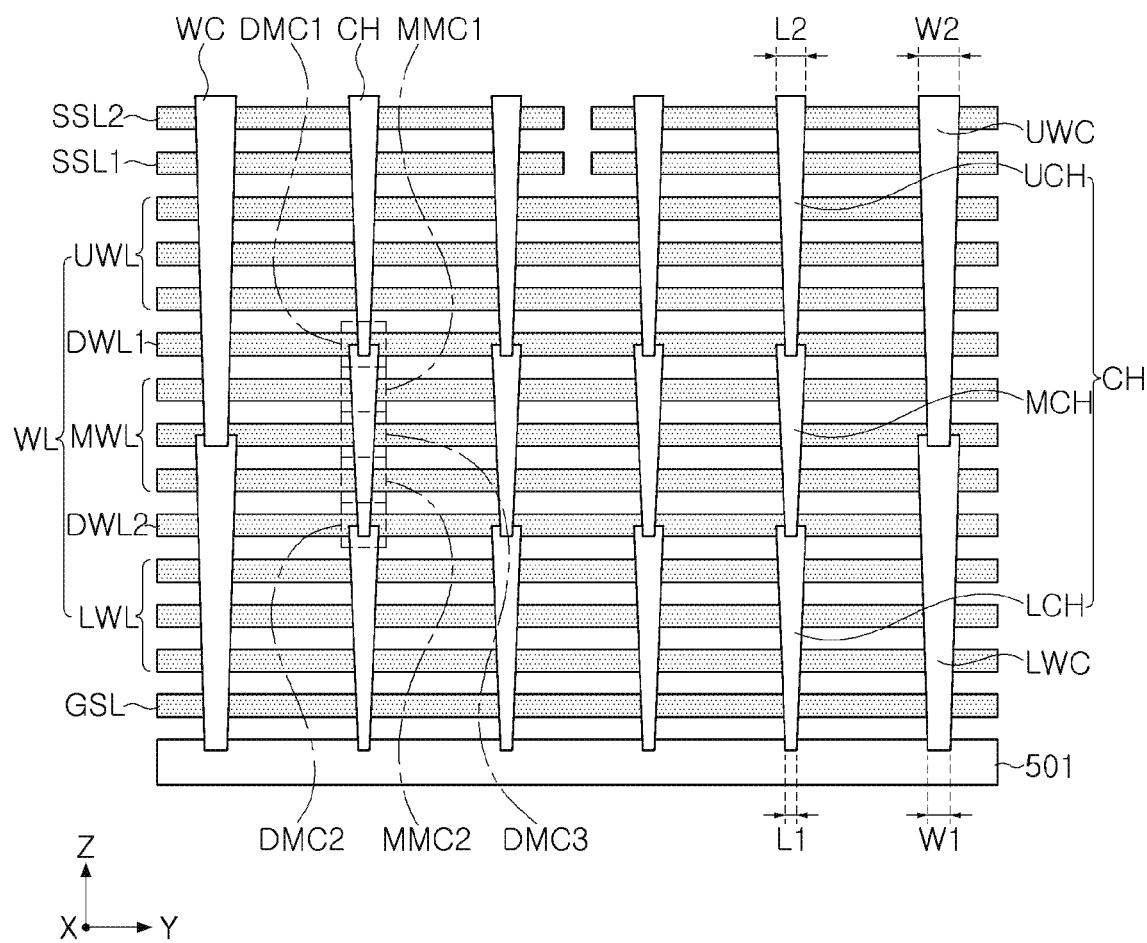

In the memory device 500C in the exemplary embodiment illustrated in FIG. 24, each of the word-line cuts WC may include the upper word-line cut UWC and the lower word-line cut LWC. In the exemplary embodiment in FIG. 24, a boundary between the upper word-line cut UWC and the lower word-line cut LWC may be disposed on a level different from levels of boundaries among the lower channel structure LCH, the intermediate channel structure MCH, and the upper channel structure UCH.

Figure 25:
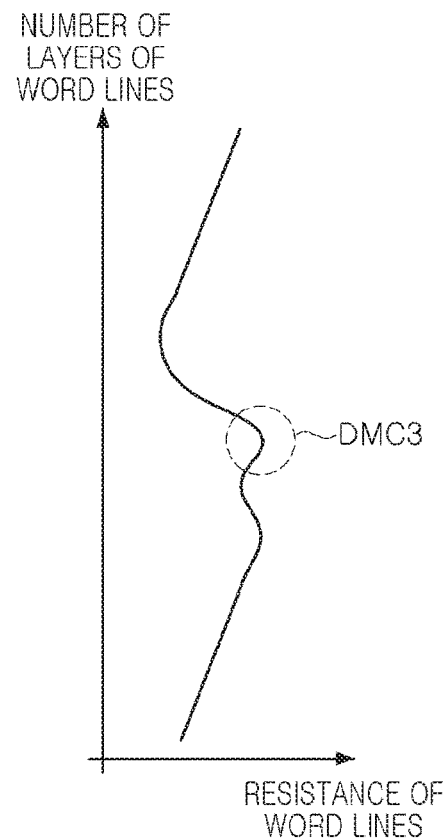

Referring to the graph in FIG. 25, resistance of word lines WL in accordance with a height from the substrate 501 may significantly change on a boundary between the upper word-line cut UWC and the lower word-line cut LWC and may increase. Accordingly, in the exemplary embodiment in FIG. 24, the first dummy memory cell DMC1 may be defined on a boundary between the intermediate channel structure MCH and the upper channel structure UCH, the second dummy memory cell DMC2 may be defined on a boundary between the lower channel structure LCH and the intermediate channel structure MCH, and a third dummy memory cell DMC3 may be defined on a boundary between the lower word-line cut LWC and the upper word-line cut UWC.

A position of the third dummy memory cell DMC3 taken in the first direction (the Z axis direction) may not match a boundary between the lower word-line cut LWC and the upper word-line cut UWC. As an example, at least one of the first and second intermediate memory cells MMC1 and MMC2 disposed on a level lower than or higher than the boundary between the lower word-line cut LWC and the upper word-line cut UWC by one level may also be allocated as a dummy memory cell. Alternatively, a memory cell disposed on the boundary between the lower word-line cut LWC and the upper word-line cut UWC may not be allocated as the third dummy memory cell DMC3. In this case, the memory cell disposed on the boundary between the lower word-line cut LWC and the upper word-line cut UWC may store data having a relatively small number of bits, and may operate as a single level cell, for example.

Figure 26:
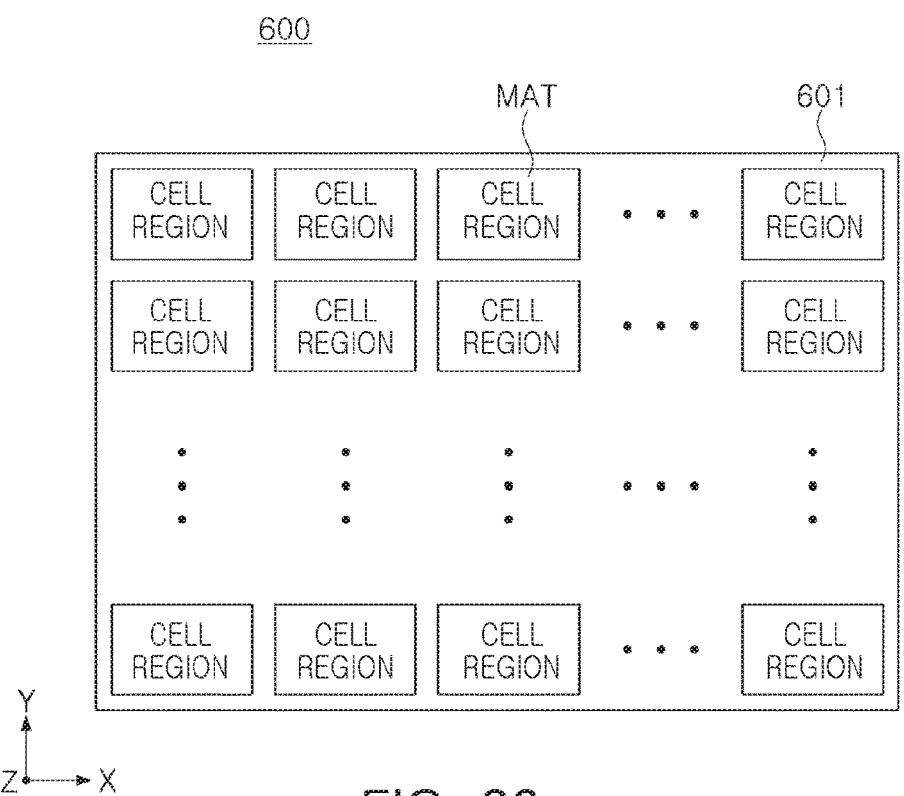
FIG. 26 is a plan diagram illustrating a memory device according to an exemplary embodiment of the present inventive concept.

FIG. 26 is a plan diagram illustrating a memory device according to an exemplary embodiment of the present inventive concept.

Referring to FIG. 26, a memory device 600 in the exemplary embodiment may include a plurality of mats MAT. As an example, the plurality of mats MAT may be configured as cell regions including a ground select line, word lines, string select lines, channel structures, word line cuts, and other elements. The mats MAT may be arranged on a substrate 601. Each of the mats MAT may include word lines stacked in a direction perpendicular to an upper surface of the substrate 601, channel structures extending in a direction perpendicular to an upper surface of the substrate 601, bit lines connected to the channel structures, and other elements. In the exemplary embodiment in FIG. 26, the memory device 600 may have a cell on peri (COP) structure, but the inventive concept is not limited thereto. Alternatively, a peripheral circuit region may be disposed on a level that is the same as a level of a cell region.

Each of the mats MAT may include a plurality of memory cell strings, and each of the memory cell strings may include a single channel structure and memory cells sharing a single channel structure. In each of the mats MAT, the memory cell strings may form one or two or more blocks.

In the memory device 600 in the exemplary embodiment illustrated in FIG. 26, the peripheral circuit region may be disposed in a lower portion of the substrate 601 in which the mats MAT are disposed. In the peripheral circuit region, at least portions of circuits for driving the memory cells included in the mats MAT, such as a row decoder, a voltage generator, a page buffer, an input and output circuit, or a control logic, for example, may be disposed.

In an exemplary embodiment of the present inventive concept, portions of the mats MAT included in the memory device 600 may operate by different methods. For example, memory cells connected to word lines disposed at a first height from the substrate 601 may store N-bit data in one of the mats MAT, and may store M-bit data, different from the N-bit data, in one of the other mats MAT. M and N may be natural numbers.

When each of the mats MAT has a plurality of blocks, blocks included in a single mat MAT may operate by different methods. For example, when it is assumed that a single mat MAT includes a first block and a second block, memory cells connected to word lines disposed on the same level from the substrate 601 may store N-bit data in the first block and may store M-bit data in the second block. M and N may be natural numbers. In the description below, the above-described configuration will be described in greater detail with reference to FIGS. 27 to 30.

Figure 27A:
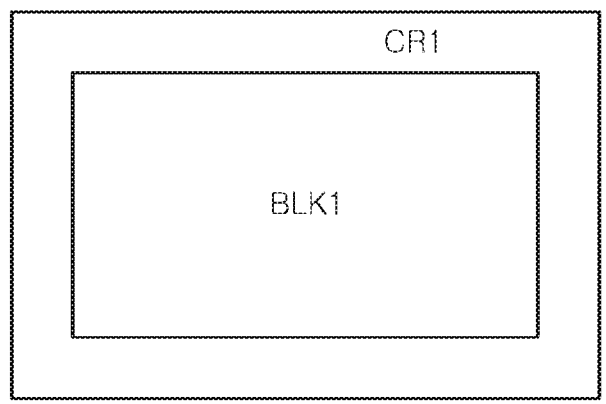
FIGS. 27A, 27B, and 28 are diagrams illustrating an operation of a memory device according to an exemplary embodiment of the present inventive concept.
Figure 27B:
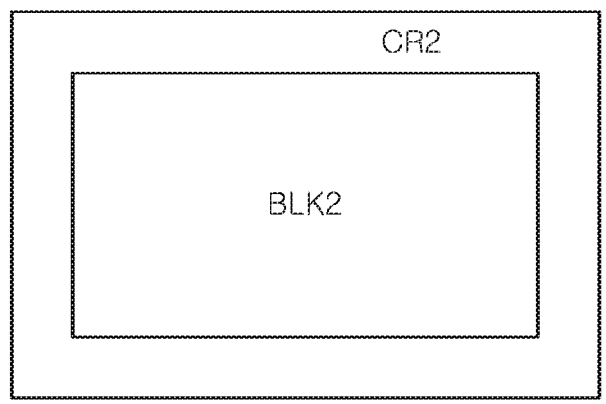
Figure 28:
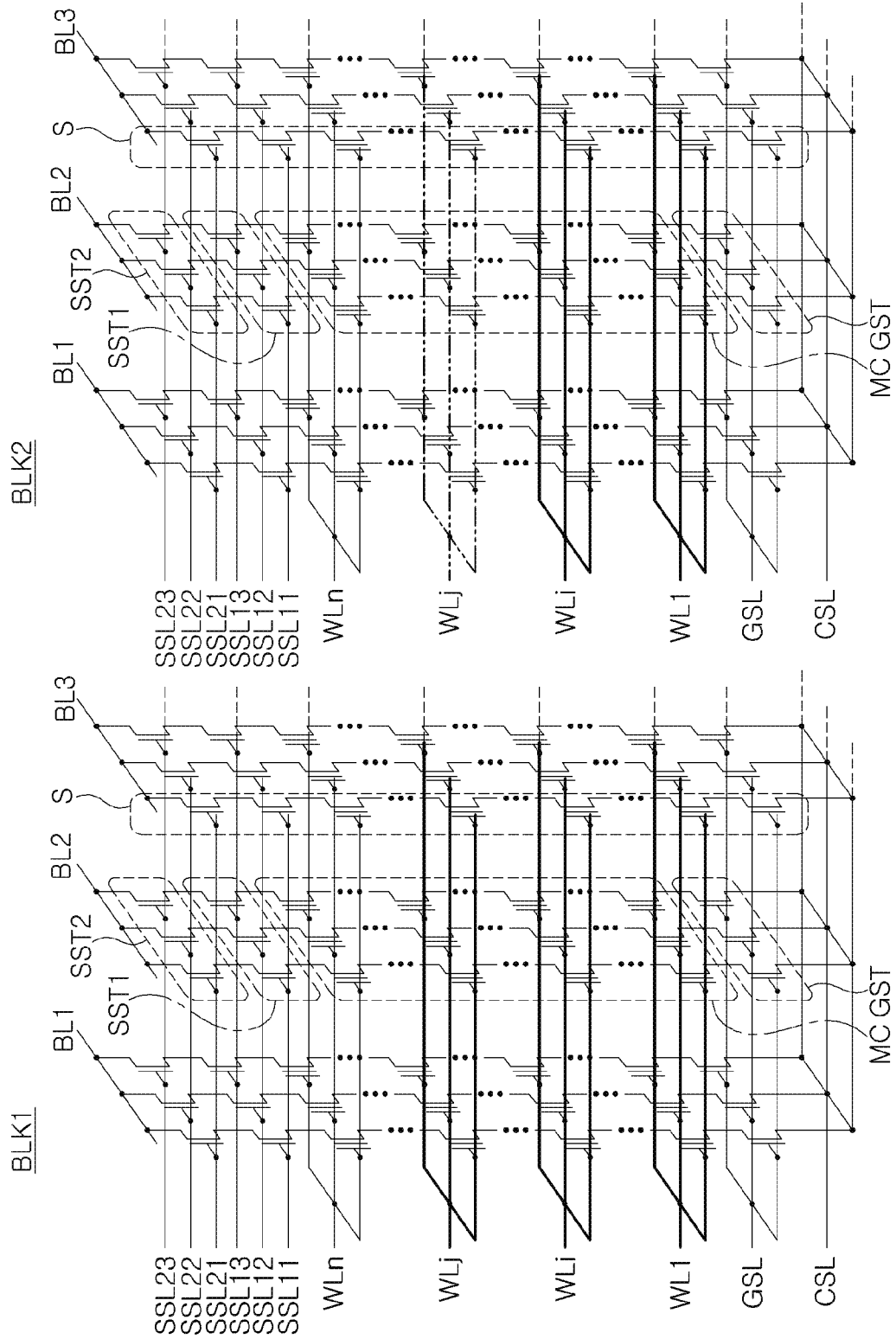

FIGS. 27A, 27B, and 28 are diagrams illustrating an operation of a memory device according to an exemplary embodiment of the present inventive concept.

Referring to FIGS. 27A and 27B, a first mat MAT1 included in a memory device may include a first block BLK1, and a second mat MAT2 may include a second block BLK2. A first contact region CR1 may be disposed around the first block BLK1, and a second contact region CR2 may be disposed around the second block BLK2. As an example, word lines may be connected to cell contacts in the contact regions CR1 and CR2. As described in the aforementioned exemplary embodiment with reference to FIG. 26, the first block BLK1 and the second block BLK2 may be controlled by different methods.

Referring to FIG. 28, in the first block BLK1, capacity of data stored in the memory cells MC connected to the partial word line WLn may be smaller than capacity of data stored in the memory cells MC connected to the other word lines WL1, WLi, and WLj. For example, the memory cells MC connected to the partial word line WLn may operate as a single level cell, and the memory cells MC connected to the other word lines WL1, WLi, and WLj may operate as a multilevel cell, a triple level cell, a quad level cell, or the like.

In the second block BLK2, capacity of data stored in the memory cells MC connected to the partial word line WLn may be smaller than capacity of data stored in the memory cells MC connected to a further partial word line WLj. Additionally, capacity of data stored in the memory cells MC connected to the further partial word line WLj may be smaller than capacity of data stored in memory cells MC connected to the other word lines WL1 and WLi. For example, a single memory cell string S may include at least one memory cell MC operating as a single level cell, at least one memory cell MC operating as a multilevel cell, and at least one memory cell MC operating as a triple level cell or a quad level cell.

Thus, the first mat MAT1 and the second mat MAT2 may operate using different methods. Referring to FIG. 28, capacity of data stored in the memory cells MC connected to the single word line WLj, disposed on the same level from the substrate, in the first mat MAT1 may be different from capacity of data stored in the memory cells MC connected to the single word line WLj in the second mat MAT2.

Figure 29:
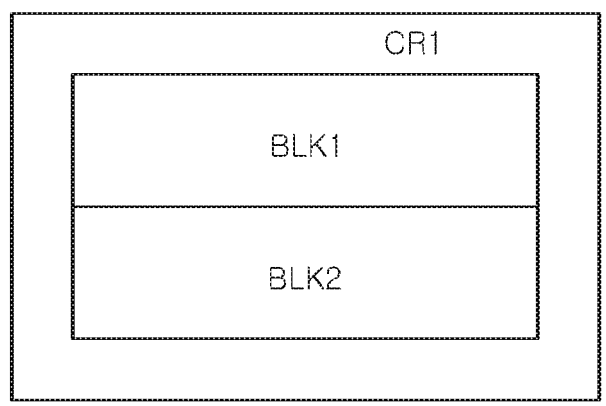
FIGS. 29 and 30 are diagrams illustrating an operation of a memory device according to an exemplary embodiment of the present inventive concept.
Figure 30:
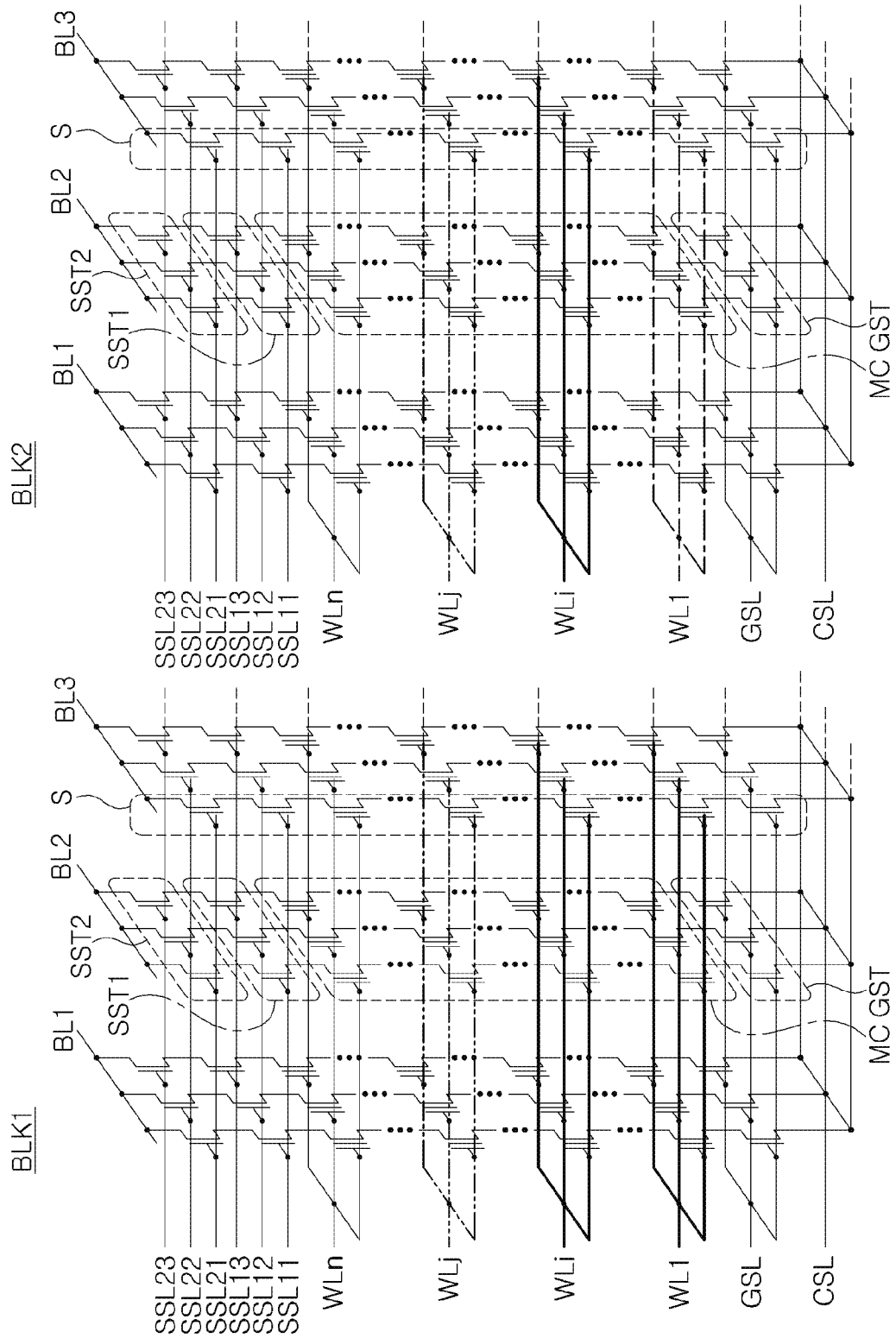

FIGS. 29 and 30 are diagrams illustrating an operation of a memory device according to an exemplary embodiment of the present inventive concept.

Referring to FIG. 29, the first mat MAT1 included in a memory device may include the first block BLK1 and the second block BLK2, and the first contact region CR1 may be disposed around the first block BLK1 and the second block BLK2. In an exemplary embodiment of the present inventive concept, the first block BLK1 and the second block BLK2 included in a single first mat MAT1 may be controlled by different methods.

Referring to FIG. 30, in the first block BLK1, capacity of data stored in the memory cells MC connected to the partial word line WLn may be smaller than capacity of data stored in memory cells MC connected to the further partial word line WLj. Additionally, capacity of data stored in the memory cells MC connected to the further partial word line WLj may be smaller than capacity of data stored in the memory cells MC connected to one of the other word lines WL1 and WLi. For example, the memory cells MC connected to the word line WLn may operate as single level cells, the memory cells MC connected to the word line WLj may operate as multilevel cells, and the memory cells MC connected to the word lines WL1 and WLi may operate as triple level cells.

In the second block BLK2, the memory cells connected to the word line WLn may operate as single level cells, the memory cells MC connected to the word line WLj may operate as multilevel cells, and the memory cells MC connected to the word line WLi may operate as triple level cells. Additionally, the memory cells MC connected to the word line WL1 may operate as quad level cells. Accordingly, capacity of data stored in the memory cells MC connected to the single word line WL1, disposed on the same level from the substrate, in the first mat MAT1 may be different from capacity of data stored in the memory cells MC connected to the single word line WL1 in the second mat MAT2.

Figure 31:
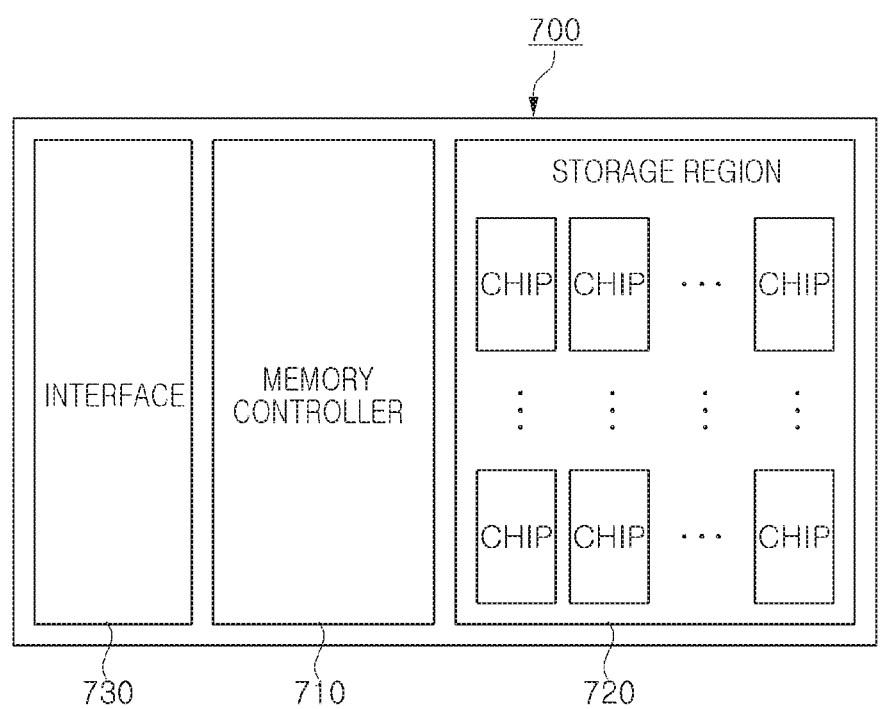
FIGS. 31 and 32 are diagrams illustrating an operation of a memory device according to an exemplary embodiment of the present inventive concept.
Figure 32:
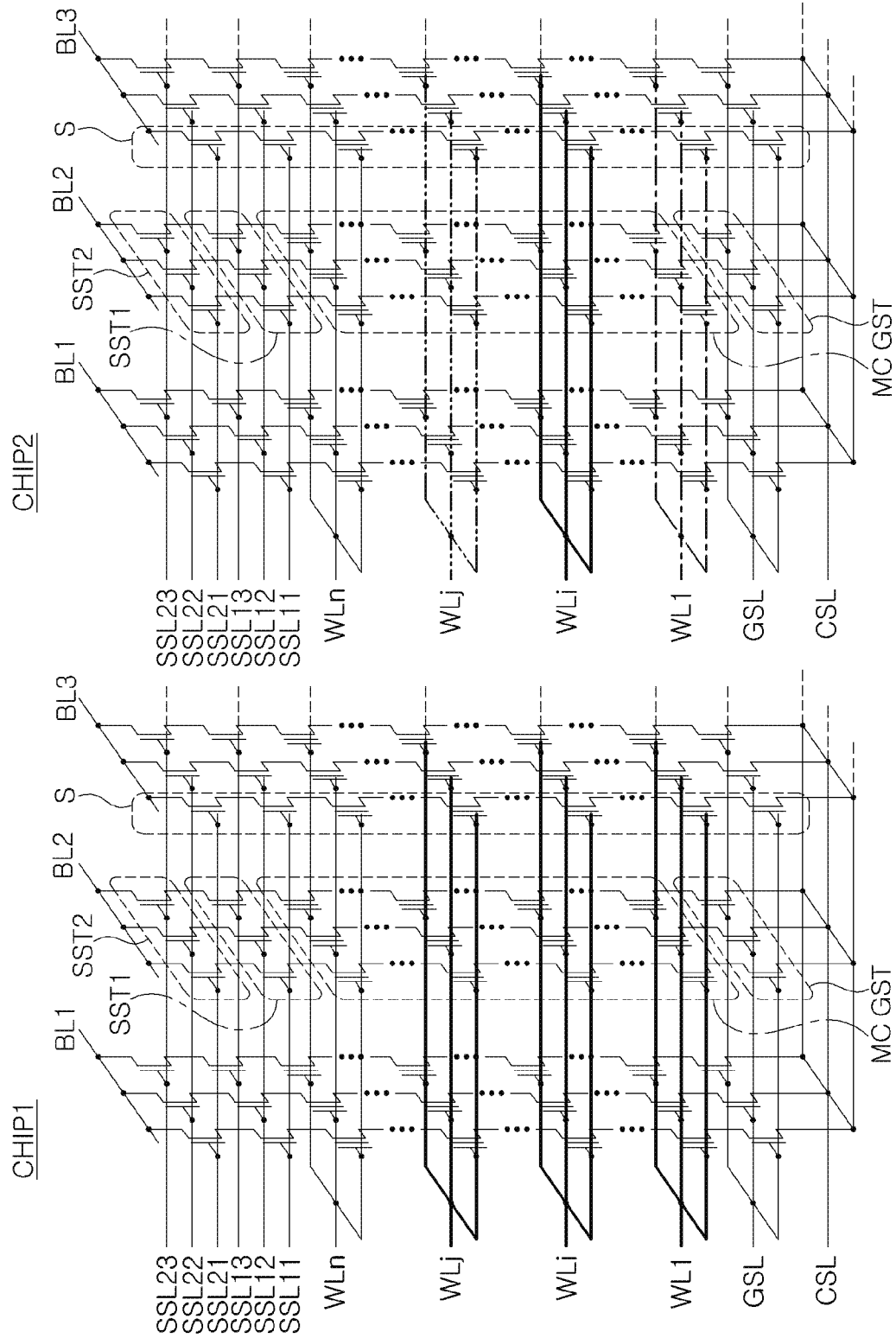

FIGS. 31 and 32 are diagrams illustrating an operation of a memory device according to an exemplary embodiment of the present inventive concept.

Referring to FIG. 31, a memory device in the exemplary embodiment may be provided as a storage region 720 of a storage device 700, such as a solid state drive (SSD) or the like. The storage device 700 may include a memory controller 710 controlling the storage region 720, an interface 730 connected to an external host and transmitting data to and receiving data from the external host, and other elements.

The storage region 720 may include a plurality of memory chips CHIP. In the exemplary embodiment of FIG. 31, at least portions of the memory chips CHIP may be controlled by different methods. In the description below, the above-mentioned configuration will be described in greater detail with reference to FIG. 32.

Referring to FIG. 32, a first memory chip CHIP1 and a second memory chip CHIP2 may operate by different methods. In the first memory chip CHIP1, capacity of data stored in the memory cells MC connected to the partial word line WLn may be smaller than capacity of data stored in the memory cells MC connected to the other word lines WL1, WLi, and WLj. For example, the memory cells MC connected to the partial word line WLn may operate as single level cells, and the memory cells MC connected to the other word lines WL1, WLi, and WLj may operate as multilevel cells, triple level cells, quad level cells, or the like.

In the second memory chip CHIP2, the memory cells MC connected to the word line WLn may operate as single level cells, the memory cells MC connected to the word line WLj may operate as multilevel cells, and the memory cells MC connected to the word lines WLi may operate as triple level cells. Additionally, the memory cells MC connected to the word line WL1 may operate as a quad level cell. Accordingly, capacity of data stored in the memory cells MC connected to the word lines WL1 and WLj, disposed on the same level from the substrate, in the first memory chip CHIP1 may be different from capacity of data stored in the memory cells MC connected to the word lines WL1 and WLj in the second memory chip CHIP2.

Each of the memory chips CHIP may include a plurality of mats MAT. As an example, each of the mats MAT included in a single memory chip CHIP may be controlled by different methods as described in the aforementioned exemplary embodiments with reference to FIGS. 27 and 28. Additionally, when each of the mats MAT included in a single memory chip CHIP includes a plurality of blocks BLK, the blocks BLK may be controlled by different methods as described in the aforementioned exemplary embodiments with reference to FIGS. 29 and 30.

Figure 33:
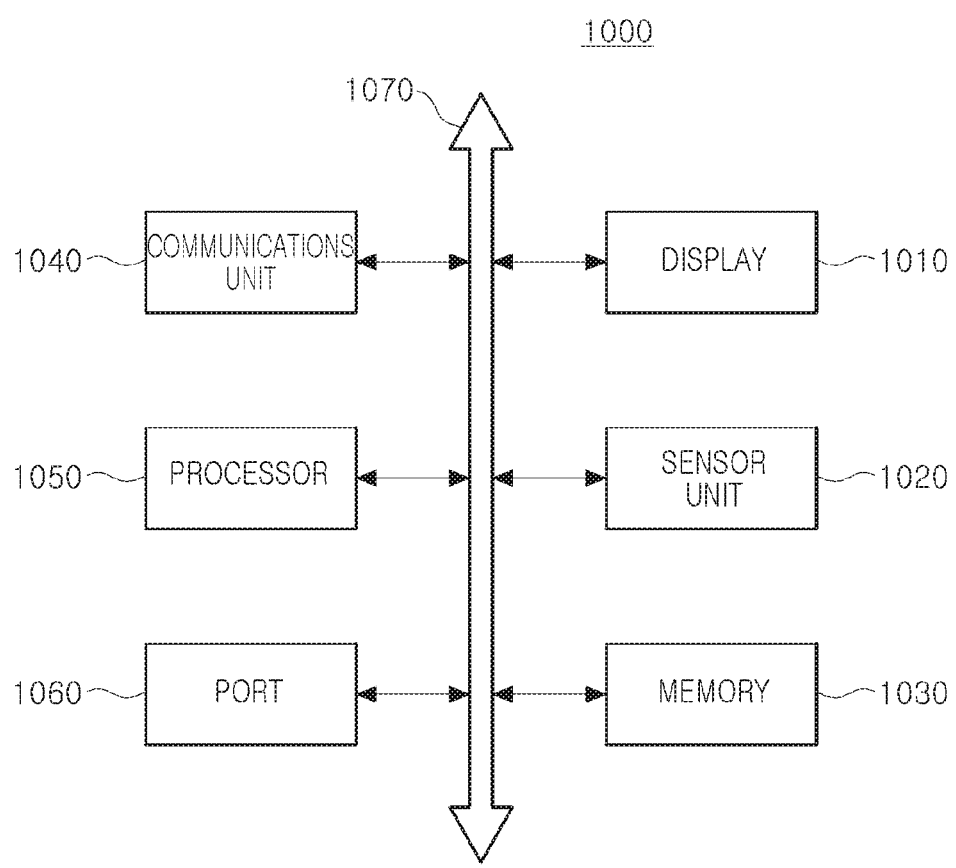
FIG. 33 is a block diagram illustrating an electronic device including a memory device according to an exemplary embodiment of the present inventive concept.

FIG. 33 is a block diagram illustrating an electronic device including a memory device according to an exemplary embodiment of the present inventive concept.

An electronic device 1000 in the exemplary embodiment illustrated in FIG. 33 may include a display 1010, a sensor 1020, a memory 1030, a communicator 1040, a processor 1050, a port 1060, and other elements. The electronic device 1000 may further include a power device, an input and output device, and other elements. Among the elements illustrated in FIG. 33, the port 1060 may be provided for the electronic device 1000 to communicate with a video card, a sound card, a memory card, a USB device, or the like. The electronic device 1000 may include a general desktop computer or a laptop computer, and may also include a smartphone, a tablet personal computer (PC), a smart wearable device, or the like.

The processor 1050 may perform a certain calculation or may process a command word, a task, or the like. The processor 1050 may be implemented as a central processing unit (CPU), a microprocessor unit (MCU), a system on chip (SoC), or the like, and may communicate with the display 1010, the sensor 1020, the memory 1030, the communicator 1040, and other devices connected to the port 1060 through a bus 1070.

The memory 1030 may be a storage medium which stores data for operation of the electronic device 1000, multimedia data, or the like. The memory 1030 may include a volatile memory such as a random access memory (RAM), or a non-volatile memory such as a flash memory or the like. The memory 1030 may include at least one of a solid state drive (SSD), a hard disk drive (HDD), or an optical disc drive (ODD) as a storage device. In the exemplary embodiment in FIG. 33, the memory 1030 may include the memory device according to the aforementioned exemplary embodiments described with reference to FIGS. 1 to 32.

According to the aforementioned exemplary embodiments of the present inventive concept, the memory device may include a plurality of memory cell strings connected to a plurality of memory cells, and memory cells included in at least one of the memory cell strings may include a first memory cell and a second memory cell disposed on different levels in a direction perpendicular to an upper surface of a substrate. The number of bits of pieces of data stored in the first memory cell and in the second memory cell may be determined differently in consideration of properties of the first memory cell and the second memory cell. Accordingly, reliability of the memory device may improve, a lifespan of the memory device may be extended, and integration density of the memory device may improve.

While the inventive concept has been shown and described above with reference to exemplary embodiments thereof, it will be apparent to those of ordinary skill in the art that modifications and variations in form and details could be made thereto without departing from the spirit and scope of the present inventive concept as set forth by the appended claims.

What is claimed is:

1. A memory device, comprising:
a plurality of word lines stacked on an upper surface of a substrate;
a plurality of channel structures penetrating through the plurality of word lines, and each including a plurality of channel regions connected to one another in a first direction perpendicular to the upper surface of the substrate; and
word-line cuts extending in the first direction and dividing the plurality of word lines to a plurality of blocks,
wherein the plurality of word lines and the plurality of channel structures provide a plurality of memory cell strings, and each of the plurality of memory cell strings include a plurality of memory cells arranged in the first direction, and
wherein the plurality of memory cells included in at least one of the plurality of memory cell strings include a first memory cell and a second memory cell disposed at different positions in the first direction, and the number of bits of data stored in the first memory cell is less than the number of bits of data stored in the second memory cell.

2. The memory device of claim 1,
wherein the plurality of word lines include a first word line connected to the first memory cell and a second word line connected to the second memory cell, and
wherein the first word line has a resistance greater than a resistance of the second word line.

3. The memory device of claim 1,
wherein each of the plurality of channel structures includes a lower channel region extending from the upper surface of the substrate and an upper channel region extending from the lower channel region, and
wherein a width of the upper channel region is less than a width of the lower channel region in a region adjacent to a boundary between the lower channel region and the upper channel region.

4. The memory device of claim 3, wherein the first memory cell is disposed closer to the boundary between the lower channel region and the upper channel region than the second memory cell.

5. The memory device of claim 3, wherein a memory cell adjacent to the boundary between the lower channel region and the upper channel region is configured as a dummy memory cell.

6. The memory device of claim 3, wherein the first memory cell and the second memory cell are provided by the lower channel region, and the second memory cell is disposed closer to the upper surface of the substrate than the first memory cell.

7. The memory device of claim 3, wherein the first memory cell and the second memory cell are provided by the upper channel region, and the second memory cell is disposed closer to the upper surface of the substrate than the first memory cell.

8. The memory device of claim 3, wherein the first memory cell is provided by the lower channel region and the second memory cell is provided by the upper channel region.

9. The memory device of claim 1, wherein the plurality of memory cells include a third memory cell disposed at a position different from positions of the first memory cell and the second memory cell in the first direction, and the number of bits of data stored in the third memory cell is greater than the number of bits of data stored in the second memory cell.

10. The memory device of claim 9,
wherein the plurality of word lines include a first word line connected to the first memory cell, a second word line connected to the second memory cell, and a third word line connected to the third memory cell, and
wherein a resistance of the second word line is smaller than a resistance of the first word line, and is greater than a resistance of the third word line.

11. The memory device of claim 10,
wherein the first word line, the second word line, and the third word line are penetrated by one of the plurality of channel regions, and
wherein the second word line is disposed between the first word line and the third word line, and the first word line is disposed further from the upper surface of the substrate than the third word line.

12. A memory device, comprising:
a lower stack structure including lower word lines stacked on an upper surface of a substrate, and lower channel regions extending from the upper surface of the substrate and penetrating through the lower word lines,
wherein the lower word lines and the lower channel regions provide lower memory cells; and
an upper stack structure including upper word lines stacked on the lower stack structure, and upper channel regions penetrating through the upper word lines and connected to the lower channel regions, wherein the upper word lines and the upper channel regions provide upper memory cells,
wherein data storage capacity of the lower memory cells is greater than data storage capacity of the upper memory cells.

13. The memory device of claim 12, further comprising:
word-line cuts dividing the lower stack structure and the upper stack structure into a plurality of blocks,
wherein a profile of a side surface of each of the word-line cuts is different from a profile of a side surface of each of channel structures including the lower channel regions and the upper channel regions.

14. The memory device of claim 13, wherein each of the word-line cuts includes a lower word-line cut extending from the upper surface of the substrate and an upper word-line cut extending from the lower word-line cut, and a height of the lower word-line cut is substantially the same as a height of each of the lower channel regions.

15. The memory device of claim 13, wherein each of the word-line cuts includes a lower word-line cut extending from the upper surface of the substrate and an upper word-line cut extending from the lower word-line cut, and a height of the lower word-line cut is different from a height of each of the lower channel regions.

16. The memory device of claim 12, wherein a sum of thicknesses of the upper word lines is greater than a sum of thicknesses of the lower word lines.

17. A memory device, comprising:
ground select transistors connected to a common source line and a ground select line;
string select transistors connected to bit lines and at least one string select line;
memory cells connected to one another in series between the ground select transistors and the string select transistors and connected to word lines; and
a memory controller configured to control the ground select transistors, the string select transistors, and the memory cells,
wherein the ground select transistors, the string select transistors, and the memory cells provide a single memory block,
wherein capacity of data stored in first memory cells connected to a first word line of the word lines by the memory controller is different from capacity of data stored in second memory cells connected to a second word line by the memory controller, and
wherein the second word line is different from the first word line.

18. The memory device of claim 17, wherein the capacity of data stored in the second memory cells is an integer multiple of the capacity of data stored in the first memory cells.

19. The memory device of claim 17, wherein the first word line has a resistance greater than a resistance of the second word line.

20. The memory device of claim 17, wherein a first program speed of storing data in the first memory cells by the memory controller is faster than a second program speed of storing data in the second memory cells by the memory controller.

* * * * *